(12) United States Patent
Kitahama et al.

(10) Patent No.: US 9,356,196 B2
(45) Date of Patent: May 31, 2016

(54) METHOD OF MANUFACTURING LIGHT EMITTING ELEMENT

(71) Applicant: Nichia Corporation, Anan-shi, Tokushima (JP)

(72) Inventors: Shun Kitahama, Tokushima (JP); Keiji Emura, Anan (JP); Shinichi Daikoku, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/802,985

(22) Filed: Jul. 17, 2015

(65) Prior Publication Data
US 2016/0020363 A1    Jan. 21, 2016

(30) Foreign Application Priority Data

Jul. 18, 2014   (JP) ................................ 2014-148289

(51) Int. Cl.
| | |
|---|---|
| H01L 33/00 | (2010.01) |
| H01L 33/40 | (2010.01) |
| H01L 33/42 | (2010.01) |
| H01L 33/44 | (2010.01) |
| H01L 33/38 | (2010.01) |
| H01L 33/32 | (2010.01) |

(52) U.S. Cl.
CPC .............. *H01L 33/405* (2013.01); *H01L 33/32* (2013.01); *H01L 33/38* (2013.01); *H01L 33/42* (2013.01); *H01L 33/44* (2013.01); *H01L 2933/0016* (2013.01); *H01L 2933/0025* (2013.01)

(58) Field of Classification Search
CPC ......... H01L 33/38; H01L 33/32; H01L 33/42; H01L 33/44; H01L 33/405; H01L 2933/0025; H01L 2933/0016
USPC .......................................................... 438/22
See application file for complete search history.

(56) References Cited

U.S. PATENT DOCUMENTS

| | | | |
|---|---|---|---|
| 2011/0255294 A1 | 10/2011 | Okabe et al. | |
| 2011/0284908 A1 | 11/2011 | Muramoto et al. | |
| 2012/0273823 A1 | 11/2012 | Yoneda et al. | |
| 2013/0020599 A1 | 1/2013 | Han et al. | |
| 2013/0307007 A1 | 11/2013 | Choi et al. | |

FOREIGN PATENT DOCUMENTS

| | | | |
|---|---|---|---|
| JP | 2008-192710 A | 8/2008 | |
| JP | 2010-062425 A | 3/2010 | |
| JP | 2010-153581 A | 7/2010 | |
| JP | 2010-192859 A | 9/2010 | |
| JP | 2012-238823 A | 12/2012 | |

*Primary Examiner* — Savitr Mulpuri
(74) *Attorney, Agent, or Firm* — Foley & Lardner LLP

(57) ABSTRACT

A method of manufacturing a semiconductor light emitting element includes providing a semiconductor stacked layer body; forming an insulating layer on a portion of the semiconductor stacked layer body; forming a light-transmissive electrode covering an upper surface of the semiconductor stacked layer body and an upper surface of the insulating layer, and on a region at least partially overlapping a region for disposing an extending portion in a plan view; forming a light reflecting layer in each of the openings of the light-transmissive electrode; forming a protective layer on a main surface side of the semiconductor stacked layer body; forming a mask on an upper surface of the protective layer except for the region for forming the pad electrode; etching the protective layer to form an opening in the protective layer; and forming a pad electrode in the opening of the protective layer.

21 Claims, 24 Drawing Sheets

US 9,356,196 B2

METHOD OF MANUFACTURING LIGHT EMITTING ELEMENT

CROSS-REFERENCE TO RELATED APPLICATION

This application claims priority to Japanese Patent Application No. 2014-148289 filed on Jul. 18, 2014. The entire disclosure of Japanese Patent Application No. 2014-148289 is hereby incorporated herein by reference.

BACKGROUND

1. Technical Field

The present disclosure relates to a method of manufacturing a semiconductor light emitting element.

2. Description of the Related Art

Light emitting elements employing a nitride semiconductor have a wide band gap that allows the light emitting elements to emit light in the near-ultraviolet to red range, thus, various kinds of studies have been conducted. A typical basic structure of a nitride semiconductor light emitting element includes a stacked-layer structure of an n-type semiconductor layer, an active layer, and a p-type semiconductor layer that are stacked on a substrate, and an electrode is disposed on the p-type semiconductor layer and on a portion of the n-type semiconductor layer that is partially exposed by partially removing the p-type semiconductor layer and the active layer. Studies have been conducted on a structure of a semiconductor light emitting element; particularly, with an aim to obtain higher output, various structures for semiconductor light emitting elements and for electrodes have been proposed.

Semiconductor light emitting elements suitable for face-up type mounting, in which the side having the semiconductor stacked layer serves as the light extracting side, generally include a configuration in which a light-transmissive electrode is formed on approximately a whole upper surface of the p-type semiconductor layer by using a light-transmissive electrically conductive material such as indium tin oxide (ITO), and a p-side pad electrode is disposed on a portion of the light-transmissive electrode. In order to improve current diffusion to the p-type semiconductor layer, a metal material that has a smaller electric resistance is used to form an extending portion which is extended from an external connection portion of the p-side pad electrode onto a wide area of the light-transmissive electrode. For semiconductor light emitting elements having such a structure, for example, as proposed in JP 2008-192710A, in order to reduce optical absorption by the light-transmissive electrode (whole surface electrode) and the p-side pad electrode, a semiconductor light emitting element structure in which an insulating layer made of $SiO_2$ or the like that has a refractive index lower than that of the light-transmissive electrode is provided in the region under the p-side electrode and between the light-transmissive electrode and the p-type semiconductor layer.

For example, JP 2010-62425A proposes that, in order to reduce optical absorption by the bonding layer made of Au or the like in a pad electrode, an electrode structure in which a metal reflecting layer made of Ag, Al, or the like, having high light-reflecting properties, is provided at a lower surface side of the bonding layer.

Meanwhile, the surfaces of the semiconductor light emitting element may be covered with a protective layer made of a light-transmissive insulating material, except for the upper surfaces of the pad electrodes, which are to serve as external connection parts. A number of manufacturing steps are required in production of semiconductor light emitting elements, and reduction of the number of manufacturing steps has been expected. In order to comply with such a demand, a manufacturing method for simplifying manufacturing steps of semiconductor light emitting elements is disclosed, for example, in JP 2012-238823. According to JP 2012-238823, a patterned protective layer is formed in a manner that the entire surface of the semiconductor light emitting element, inclusive of the light-transmissive electrode (whole surface electrode), is covered with a protective layer; a resist pattern defining openings at regions to provide pad electrodes is formed by using a photolithography method; and the protective layer in the openings of the resist pattern is removed by etching. Next, metal layers to serve as the pad electrodes are formed. Then, the resist pattern is removed. Thus, the metal layers are patterned. Accordingly, the pad electrodes are formed. With the method described above, the resist pattern can be shared for forming the protective layer and for forming the metal layer, and accordingly, the manufacturing steps can be simplified.

SUMMARY

An object of certain embodiments of the present invention is to provide a method of manufacturing a semiconductor light emitting element in which reduction in the absorption of light emitted from a semiconductor stacked layer body by the pad electrodes, and good productivity can be achieved.

In an exemplary embodiment, a method is provided for manufacturing a semiconductor light emitting element that includes, on a main surface of a substrate, a semiconductor stacked layer body, a light-transmissive electrode disposed on the semiconductor stacked layer body, a pad electrode being electrically connected to the light-transmissive electrode and includes an external connection part for electrically connecting to the outside and an extending portion extending from the external connection part, and a protective layer for covering the semiconductor stacked layer body and the light-transmissive electrode. The method includes providing a semiconductor stacked layer body, forming an insulating layer on a partial region of the semiconductor stacked layer body, which is a region in a plan view at least partially overlap the region for forming the pad electrode, forming a light-transmissive electrode that covers an upper surface of the semiconductor stacked layer body and an upper surface of the insulating layer, and intermittently defines openings in an extending direction of the extending portions and in a plan view, in regions respectively at least partially overlap the region where the extending portion to be formed, forming a light-reflecting layer made of a metal material in each of the openings of the light-transmissive electrode so as to extend in the extending direction onto a portion of the light-transmissive electrode at each end of the opening, forming a protective layer on the main surface side of the substrate, in a plan view, forming a mask so as to cover the both end portions of the light-reflective layer in a direction perpendicular to the extending direction, on an upper surface of the protective layer except for the region for forming the pad electrode, etching the protective layer to remove the protective layer exposed in the opening of the mask by way of wet etching and to form openings in the protective layer, and forming a pad electrode in the opening of the protective layer.

According to a method of manufacturing a semiconductor light emitting element of certain embodiments of the present invention, the opening of the light-transmissive electrode is covered with a light-reflecting layer and a mask and etching of the protective layer is carried out. Thus, the etching solution can be inhibited from entering from the opening of the light-transmissive electrode, and an opening for disposing a pad electrode on the protective layer can be formed without eroding the insulating layer by the etching solution. This allows, with good productivity, production of a semiconductor light emitting element in which reduction in absorption of light emitted from the semiconductor stacked layer body by the pad electrode is achieved.

BRIEF DESCRIPTION OF THE DRAWINGS

FIG. 1A is a plan view and FIG. 1B is a cross-sectional view taken along line I-I of FIG. 1A.

FIG. 2A is an enlarged plan view of a region A of FIG. 1A, and FIG. 2B is a schematic cross-sectional view taken along line II-II of FIG. 2A.

FIG. 3A is a cross-sectional view taken along line III-III of FIG. 2A, and FIG. 3B is a cross-sectional view taken along line IV-IV of FIG. 2A.

FIG. 5A shows an arrangement region of a p-type semiconductor layer and FIG. 5B shows an arrangement region of an insulating layer.

FIG. 6A shows an arrangement region of a light-transmissive electrode and FIG. 6B shows an arrangement region of a light-reflecting layer.

FIG. 7A shows an arrangement region of an n-side electrode and a p-side electrode and FIG. 7B shows an arrangement region of a protective layer.

FIG. 10A shows a location corresponding to line I-I of FIG. 1A, FIG. 10B shows a location corresponding to line II-II of FIG. 2A, and FIG. 10C shows a location corresponding to line III-III of FIG. 2A.

FIG. 11A shows a location corresponding to line I-I of FIG. 1A, FIG. 11B shows a location corresponding to line II-II of FIG. 2A, and FIG. 11C shows a location corresponding to line III-III of FIG. 2A.

FIG. 12A shows a location corresponding to line I-I of FIG. 1A, FIG. 12B shows a location corresponding to line II-II of FIG. 2A, and FIG. 12C shows a location corresponding to line III-III of FIG. 2A.

FIG. 13A shows a location corresponding to line I-I of FIG. 1A, FIG. 13B shows a location corresponding to line II-II of FIG. 2A, and FIG. 13C shows a location corresponding to line III-III of FIG. 2A.

FIG. 14A shows a location corresponding to line I-I of FIG. 1A, FIG. 14B shows a location corresponding to line II-II of FIG. 2A, and FIG. 14C shows a location corresponding to line III-III of FIG. 2A.

FIG. 15A shows a location corresponding to line I-I of FIG. 1A, FIG. 15B shows a location corresponding to line II-II of FIG. 2A, and FIG. 15C shows a location corresponding to line III-III of FIG. 2A.

FIG. 16A shows a location corresponding to line I-I of FIG. 1A, FIG. 16B shows a location corresponding to line II-II of FIG. 2A, and FIG. 16C shows a location corresponding to line III-III of FIG. 2A.

FIG. 17A shows a location corresponding to line I-I of FIG. 1A, FIG. 17B shows a location corresponding to line II-II of FIG. 2A, and FIG. 17C shows a location corresponding to line III-III of FIG. 2A.

FIG. 18A shows a location corresponding to line I-I of FIG. 1A, FIG. 18B shows a location corresponding to line II-II of FIG. 2A, and FIG. 18C shows a location corresponding to line III-III of FIG. 2A.

FIG. 19A shows a location corresponding to line I-I of FIG. 1A, FIG. 19B shows a location corresponding to line II-II of FIG. 2A, and FIG. 19C shows a location corresponding to line III-III of FIG. 2A.

FIG. 20A shows a location corresponding to line I-I of FIG. 1A, FIG. 20B shows a location corresponding to line II-II of FIG. 2A, and FIG. 20C shows a location corresponding to line III-III of FIG. 2A.

FIG. 21A shows a location corresponding to line I-I of FIG. 1A, FIG. 21B shows a location corresponding to line II-II of FIG. 2A, and FIG. 21C shows a location corresponding to line III-III of FIG. 2A.

FIG. 22A shows a location corresponding to line I-I of FIG. 1A, FIG. 22B shows a location corresponding to line II-II of FIG. 2A, and FIG. 22C shows a location corresponding to line III-III of FIG. 2A.

FIG. 23A shows a location corresponding to line I-I of FIG. 1A, FIG. 23B shows a location corresponding to line II-II of FIG. 2A, and FIG. 23C shows a location corresponding to line III-III of FIG. 2A.

FIG. 24A shows a location corresponding to line I-I of FIG. 1A, FIG. 24B shows a location corresponding to line II-II of FIG. 2A, and FIG. 24C shows a location corresponding to line III-III of FIG. 2A.

DETAILED DESCRIPTION OF THE EMBODIMENTS

Figure 1A:
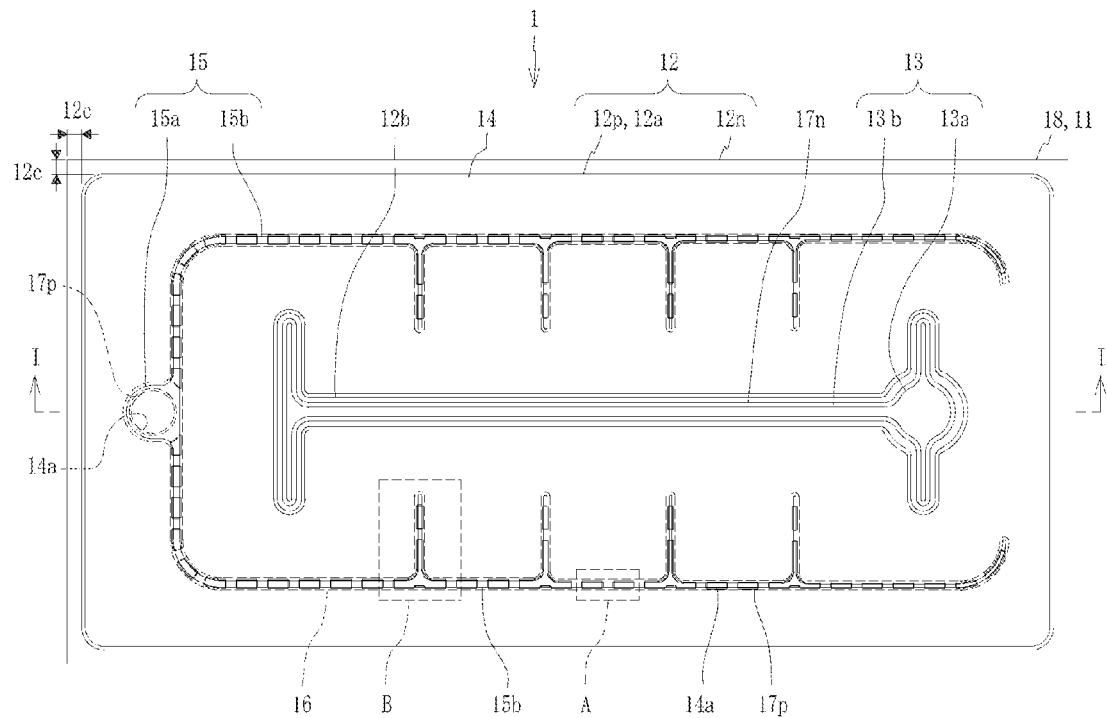
FIGS. 1A and 1B are schematic diagram showing a configuration of a semiconductor light emitting element according to an embodiment of the present invention, where

A method of manufacturing a semiconductor light emitting element according to embodiments of the present invention will be described below with reference to the drawings. The drawings referred to in the description below are to schematically illustrate the embodiments, and the size, a space or interval, locational relationship of the components may be exaggerated or a portion of a component may not be shown. Also, the size and/or space or interval of components may not be the same between a plan view and its corresponding cross-sectional view. In the description below, the same designations or the same reference numerals denote the same or like members and duplicative descriptions will be appropriately omitted.

In the light emitting elements according to each embodiment of the present invention, relative locations expressed as "upper" and "lower", "left" and "right" and so forth may be reversed, depending on the situation. In the present specification, terms such as "upper" and "lower" are used to illustrate a relative locational relationship between the components in a drawing which is referred to, and unless specifically indicated, are not intended to show absolute positional relationship.

Embodiment

Configuration of Semiconductor Light Emitting Element

With referring to FIGS. 1A to 7B, a configuration of a light emitting element according to a first embodiment of the present invention will be described. It should be noted that, in FIGS. 5A to 7B, hatching is used to indicate arrangement regions of specific components in a plan view and is not used to indicate regions in cross-section. The semiconductor light emitting element (hereinafter may be referred to as "light emitting element") 1 according to the present embodiment is, as shown in FIG. 1, formed in a laterally-long rectangular shape and includes a growth substrate 11, a semiconductor stacked layer body 12, an n-side electrode 13, a light-transmissive electrode 14, a p-side electrode 15, an insulating layer 16, light-reflecting layers 17n and 17p, and a protective layer 18. The light emitting element 1 according to the present embodiment has a structure suitable for face-up type mounting, in which a semiconductor stacked layer body 12 having an LED (light emitting diode) structure is disposed on the growth substrate 11, and the n-side electrode 13, the light-transmissive electrode 14, and the p-side electrode 15 are disposed on one surface side of the semiconductor stacked layer body 12.

The growth substrate (substrate) 11 is for epitaxially growing the semiconductor stacked layer body 12. In the case where the semiconductor stacked layer body 12 is formed by using, for example, nitride semiconductors such as GaN (gallium nitride), examples of the growth substrate 11 include an insulating substrate such as a sapphire with a principal plane being C-plane, R-plane, or A-plane, and a spinel ($MgAl_2O_4$); and silicon carbide (SiC), silicon, ZnS, ZnO, GaAs, and diamond, and an oxide substrate such as lithium niobate and neodymium gallate.

Figure 1B:
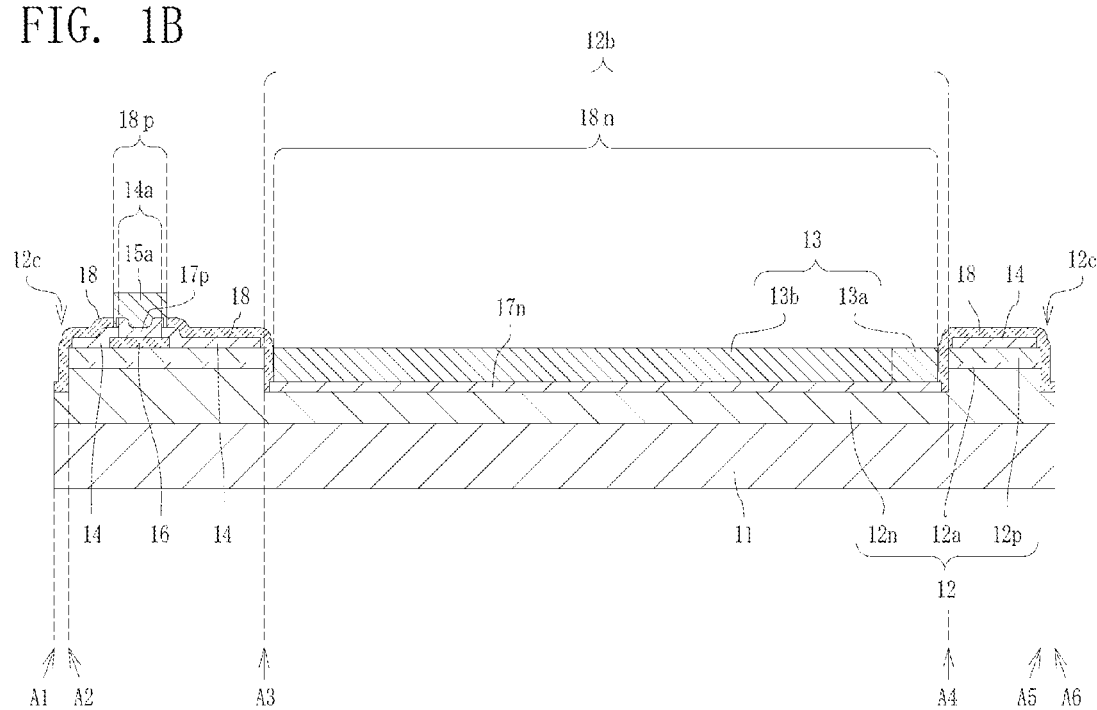
Figure 2A:
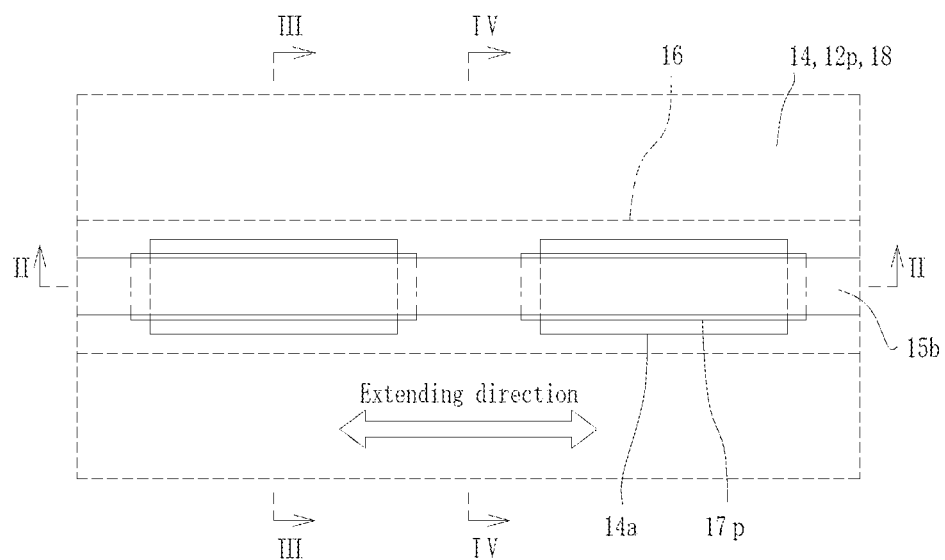
FIGS. 2A and 2B are each schematic diagram illustrating a configuration of a semiconductor light emitting element according to an embodiment of the present invention, where
Figure 2B:
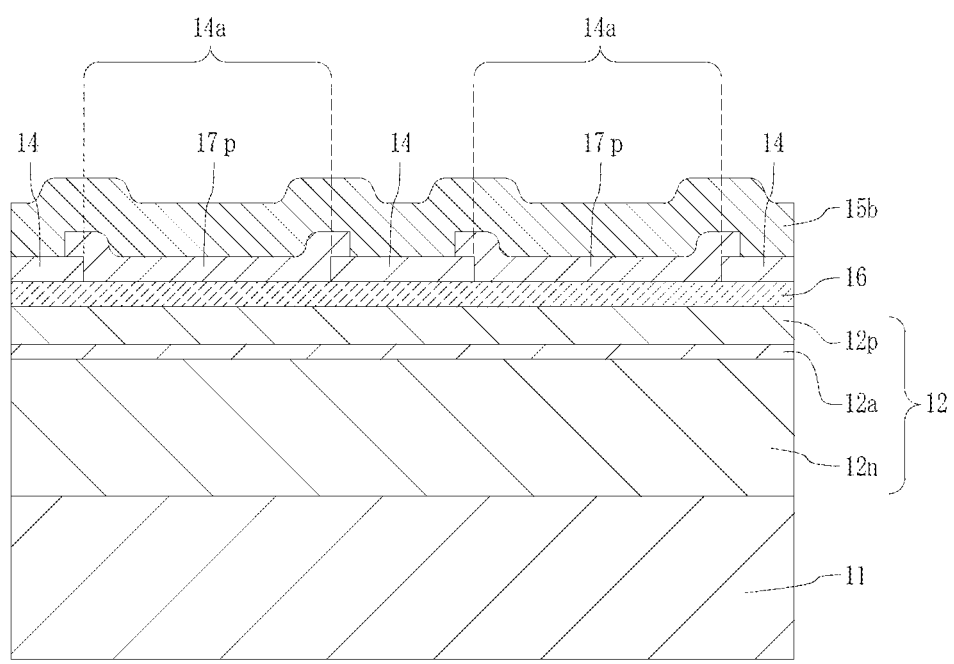

In the semiconductor stacked layer body 12, the n-type semiconductor layer 12n and the p-type semiconductor layer 12p are stacked on one main surface, which is an upper surface of the growth substrate 11. The semiconductor stacked layer body 12 emits light upon being supplied with electric current between the n-side electrode and the p-side electrode. As shown in FIG. 1B, an active layer 12a is preferably disposed between the n-type semiconductor layer 12n and the p-type semiconductor layer 12p.

Figure 5A:
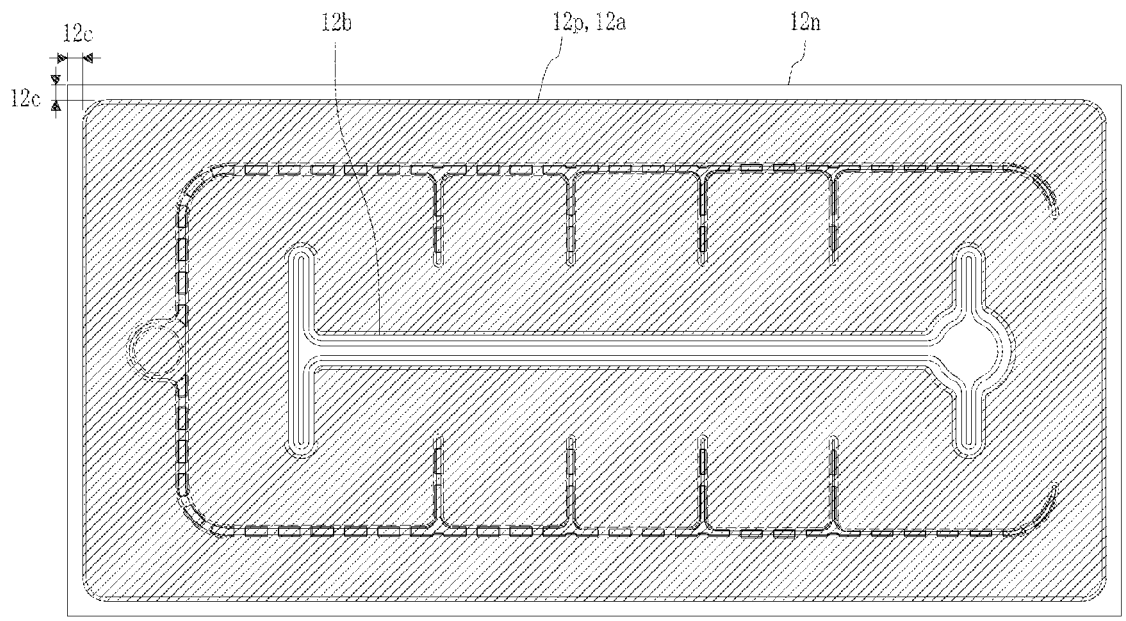
FIGS. 5A and 5B are each schematic plan view illustrating a layer structure of a semiconductor light emitting element according to an embodiment of the present invention, where

In the semiconductor stacked layer body 12, a region in which the p-type semiconductor layer 12p and the light emitting layer 12a are absent, that is a region recessed from the surface of the p-type semiconductor layer 12p (hereinafter may be referred to as "step portion 12b") is formed. The region shown with hatching in FIG. 5A is the region having the p-type semiconductor layer 12p. In the semiconductor stacked layer body 12, a first exposed portion 12b which has an H-shape in a plan view is provided. The bottom surface of the first exposed portion 12b is formed with the n-type semiconductor layer 12n, and the n-type semiconductor layer 12n and the n-side electrode 13 are electrically connected through an opening 18n of the protective layer 18 which is defined in a portion of the bottom surface.

Further, along the outer periphery of the semiconductor stacked layer body 12, the p-type semiconductor layer 12p and the active layer 12a are not present, and a second exposed portion 12c, which is an exposed region where the n-type semiconductor layer 12n is exposed, is provided. The second exposed portion 12c is provided in the boundary regions (dicing streets) along the boundary lines that demarcate individual light emitting elements 1 in a wafer state. Note that in a completed light emitting element 1, the first exposed portion 12b and the second exposed portion 12c are covered with the protective layer 18 or the n-side electrode 13, but for convenience of explanation, they are referred to as "exposed portion", respectively.

Figure 5B:
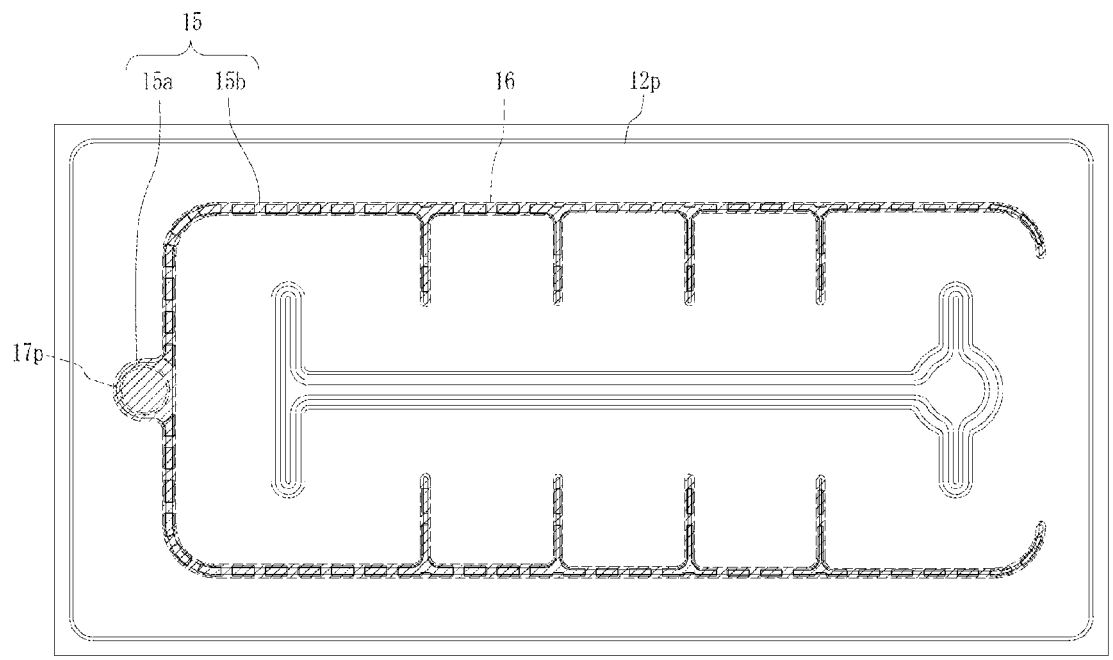
Figure 6A:
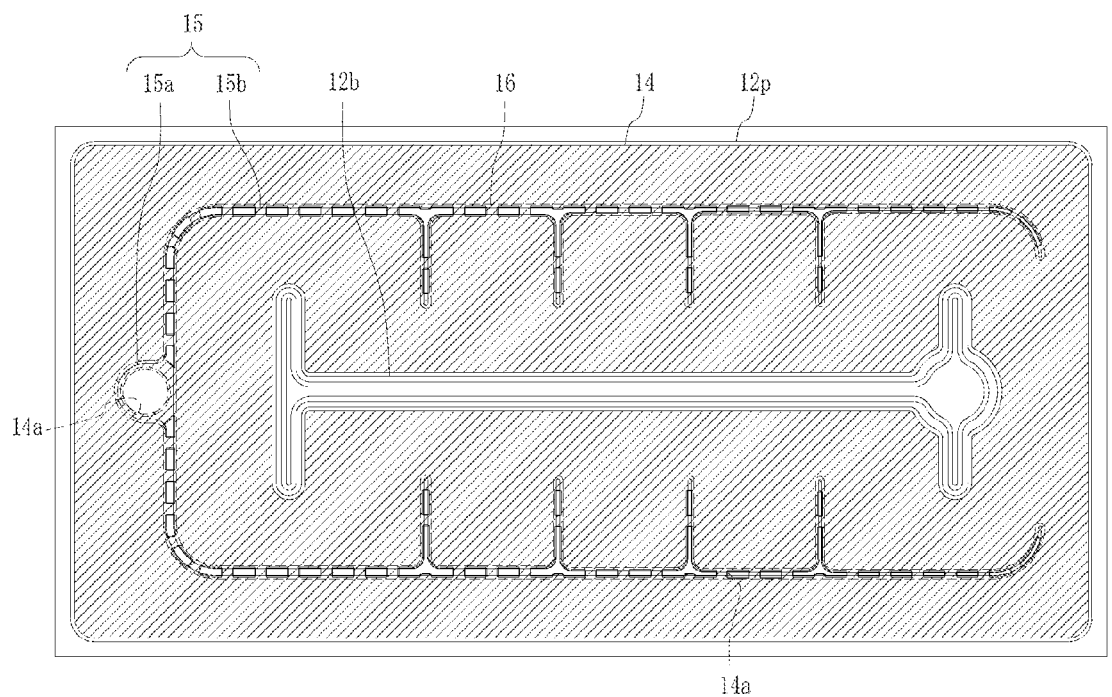
FIGS. 6A and 6B are each schematic plan view illustrating a layer structure of a semiconductor light emitting element according to an embodiment of the present invention, where

As shown by hatching in FIG. 6A, a light-transmissive electrode 14 is disposed on approximately the whole upper surface of the p-type semiconductor layer 12p. As shown by hatching in FIG. 5B, a p-side electrode 15 is disposed on a portion of an upper surface of the light-transmissive electrode 14, and an insulating layer 16 is disposed, in a plan view, between the p-type semiconductor layer 12p and the light-transmissive electrode 14. The surfaces of the semiconductor stacked layer body 12 and the whole surface electrode 14 are covered with an insulating protective layer 18 except the surfaces of the n-side electrode 13 and the p-side electrode 15 which are the pad electrodes of the light emitting element 1.

The semiconductor stacked layer body 12 can be made of a material which is suitable to a semiconductor light emitting element, such as GaN, GaAs, AlGaN, InGaN, AlInGaO, GaP, SiC, or ZnO. In the case of providing a fluorescent material layer to convert a portion of light emitted from the light emitting element 1 to light having a different wavelength, a semiconductor stacked layer body 12 which is configured to emit light of a shorter wavelength such as blue light or green light is suitable.

For the n-type semiconductor layer 12n, the light emitting layer 12a, and the p-type semiconductor layer 12p, a GaN-based compound semiconductor such as $In_XAl_YGa_{1-X-Y}N$ ($0≤X$, $0≤Y$, $X+Y≤1$) can be suitably used. Those semiconductor layers may respectively have a single-layer structure, but a stacked-layer structure, a superlattice structure, or the like, which is made of layers of different compositions and thickness may also be employed. It is particularly preferable that the light emitting 12a has a single quantum well structure or a multiquantum well structure which is made of stacked layer of thin layers each can produce quantum effect.

In the case where a GaN-based compound semiconductor is used for the semiconductor stacked layer body 12, the semiconductor layer can be formed on a growth substrate 11 which is suitable for growing a crystal of a semiconductor layer, by using a known technique such as a metal organic vapor cemical vaper deposition method (MOCVD method), an HVPE method a hydride vapor phase epitaxy method (HVPE method), or a molecular beam epitaxy method (MBE method). The thicknesses of the semiconductor layers are not specifically limited and various thicknesses can be applied.

A light-transmissive electrode 14 is, as shown by hatching in FIG. 6A, disposed to cover approximately an entire upper surface of the p-type nitride semiconductor 12p, and serves as a current diffusing layer to diffuse the current which is supplied from outside through the p-side electrode 15 onto the whole surface of the p-type nitride semiconductor layer 12p. The light emitted from the semiconductor stacked layer body 12 is extracted to the outside via the light-transmissive electrode 14. For this reason, the light-transmissive electrode 14 preferably has good light-transmissive property to light of the wavelength which is emitted from the semiconductor stacked layer body 12. Further, the light-transmissive electrode 14 defines a plurality of openings 14a, as shown in FIGS. 2A to 4, in the region on the insulating layer 16, along approximately the whole region which to be under the external connection portion 15a of the p-side electrode 15, and along the region which to be under the extending portion 15b and the regions adjacent to the region. The openings 14a are provided intermittently in the extending direction of the extending portion 15b, along the region which to be under the extending portion 15b and the regions adjacent to the region.

The light-transmissive electrode 14 is made of an electrically conducting metal oxide. Examples of the electrically conducting metal oxide include an oxide that contains at least one element selected from the group consisting of Zn, In, Sn, Ga, and Ti. Specific examples of the electrically conducting metal oxide include ZnO, AZO (Al-doped ZnO), IZO (In-doped ZnO), GZO (Ga-doped ZnO), $In_2O_3$, ITO (Sn-doped $In_2O_3$), IFO (F-doped $In_2O_3$), $SnO_2$, ATO (Sb-doped $SnO_2$), FTO (F-doped $SnO_2$), CTO (Cd-doped $SnO_2$), and $TiO_2$. Among those, ITO is a material which is highly transmissive to visible light (light in the visible region) and has a high electric conductivity, thus, ITO is suitable material to cover approximately the whole upper surface over the p-type semiconductor layer 12p.

The n-side electrode 13 is, as shown in FIG. 1B, disposed at the bottom surface of the first exposed portion 12b of the semiconductor stacked layer body 12, via the light-reflecting layer 17n. The n-side electrode 13 is a pad electrode at a negative electrode side, adapted to supply electric current from outside to the light emitting element 1, and is electrically connected to the n-type semiconductor layer 12n at the bottom surface of the first exposed portion 12b via the light-reflecting layer 17n made of a metal. In order to facilitate its connection to the outside, such as by wire bonding, for example, Cu, Au or an alloy whose main component is either of those metals can be used for the n-side electrode 13.

Figure 7A:
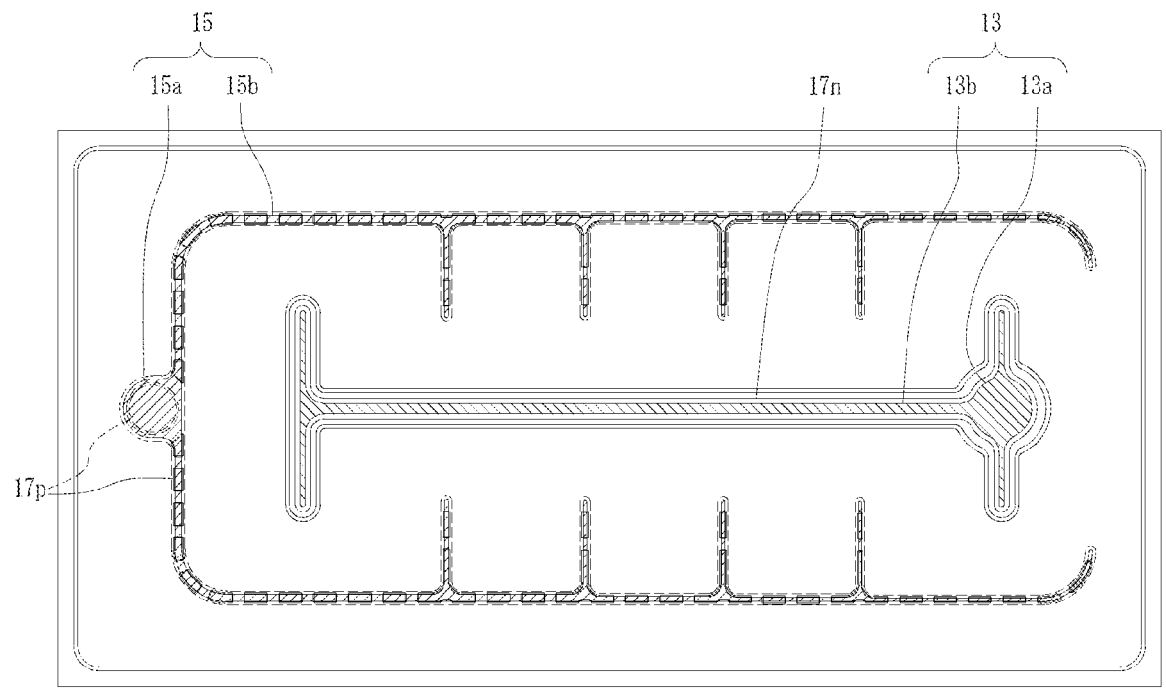
FIGS. 7A and 7B are each schematic plan view illustrating a layer structure of a semiconductor light emitting element according to an embodiment of the present invention, where

Further, as shown in FIG. 1B and is indicated by the right-downward hatching in FIG. 7A, the n-side electrode 13 is formed in an H-shape configuration in a plan view, which corresponds to the shape of the first exposed portion 12b. The n-side electrode 13 includes an external connection portion 13a formed in an approximately circular shape near the center portion in the right leg of the H-shape, and an extending portion 13b which extends from the external connection portion 13a to form the H-shape. The external connection portion 13a is a region to connect to the outside and serve to efficiently diffuse the electric current supplied via the external connection portion 13a in the whole region of the n-type semiconductor layer 12n.

The p-side electrode (pad electrode) 15 is a pad electrode at the positive terminal side, adapted to supply electric current from outside to the light emitting element 1, and is disposed on a portion of the upper surface of the light-transmissive electrode 14. The p-side electrode 15 is electrically connected to the p-type semiconductor layer 12p via the light-transmissive electrode 14. As shown by right-upward hatching in FIG. 7A, in a plan view, the p-side electrode 15 is constituted with an external connection portion 15a formed in an approximately circular shape and to serve as a region to connect to the outside, and an extending portion 15b arranged extending from the external connection portion 15a and surrounding the first exposed portion 12b. The extending portion 15b includes a plurality of extending portions each extending toward the extending portion 13b, and thus disposed in a comb-like shape in a plan view.

Further, as shown in FIG. 1A to FIG. 4, in a plan view, the insulating layer 16 is disposed between the p-type semiconductor layer 12p and the light-transmissive electrode 14 in a region under and in the vicinity of the region where the p-side electrode 15 is disposed. The light-transmissive electrode 14 disposed on the insulating layer 16 defines intermittent openings 14a along the extending direction of the extending portion 15b. The light-reflecting layer 17p is disposed in the openings 14a and extending in the extending direction of the p-side electrode onto a portion of each end of the light-transmissive electrode 14 that defines each opening. The p-side electrode 15 is disposed continuously on the light-transmissive electrode 14 and on the light-reflecting layer 17p, which are alternately arranged on the insulating layer 16.

In a similar manner as in the external connection portion 13b of the n-side electrode 13 described above, in order to facilitate its connection to the outside, such as by wire bonding, for example, Cu, Au or an alloy whose main component is either of those metals can be used for the p-side electrode 15. Note that, in the p-side electrode 15, the external connection portion 15a and the extending portion 15b are made of a same material.

The insulating layer 16 is disposed on the p-type semiconductor layer 12p and on a region under the region where the p-side electrode 15 is arranged, and the regions adjacent to the region, as shown by hatching in FIG. 5B, to enclose the p-side electrode 15 in a plan view. It is preferable that the insulating layer 16 is made of a light-transmissive material and has a refractive index that is lower than that of the light-transmissive electrode 14. Providing the insulating layer 16 on the p-type semiconductor layer 12p allows the light propagating in the semiconductor stacked layer body 12 in the upward direction to be totally reflected according to Snell's law, at the interface between the p-type semiconductor layer and the insulating layer 16. Accordingly, the insulating layer 16 is provided in the region under the p-side electrode 15 and the regions adjacent to that region so as to reflect the light traveling toward the p-side electrode before reaching the p-side electrode 15. Thus, reduction in the absorption of light by the p-side electrode 15 can be achieved.

Moreover, arranging the insulating layer 16 between the p-type semiconductor layer 12p and the light-transmissive electrode 14 allows for suppression of electric current flows into the p-type semiconductor layer 12p in the region under the p-side electrode, so that emission from this region can be suppressed. A reduction in the amount of light propagating toward the p-side electrode 15 leads to a reduction in the amount of light absorbed by the p-side electrode 15. Thus, the quantity of light emission as a whole semiconductor stacked layer body 12 can be increased. For the insulating layer 16, for example, an oxide such as $SiO_2$, $TiO_2$, or $Al_2O_3$, a nitride such as SiN, or a fluoride such as $MgF_2$ can be suitably used. Among those, $SiO_2$ that has a low refractive index can be more suitably used.

Figure 6B:
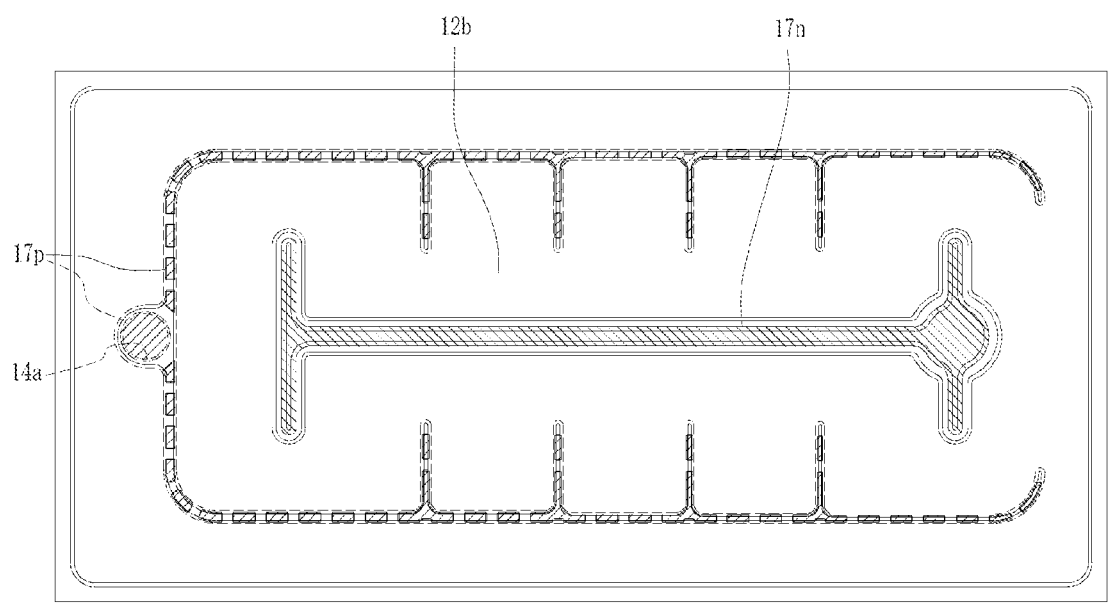

The light-reflecting layer 17p is, as shown in FIG. 2A to FIG. 4, and shown by right-upward hatching in FIG. 6B, disposed on the insulating layer 16 and in the openings 14a of the light-transmissive electrode 14. The light-reflecting layer 17p is configured to reflect light that is not reflected at the interface between the p-type semiconductor layer 12p and the insulating layer 16 and is propagating in the insulating layer 16 and direct the reflected light back to the semiconductor stacked layer body 12. The light-reflecting layer 17p is intermittently disposed on an approximately entire region under the external connection portion 15a of the p-side electrode 15, and on the region under the extending portion 15b of the p-side electrode 15 and the regions adjacent to the region.

The light-reflecting layer 17n is, as shown in FIG. 6B by right-downward hatching, disposed in an H-shape in a plan view, disposed along the bottom surface of the first exposed portion 12b so as to be in contact with the n-type semiconductor layer 12n. The light-reflecting layer 17n is configured to reflect light that is propagating in the n-type semiconductor layer 12n toward the n-side electrode 13, more efficiently than to reflect the light at the n-side electrode 13. Accordingly, the light-reflecting layer 17n is arranged, in a plan view, to enclose the region where the n-side electrode 13 is disposed. The light-reflecting layer 17n is made of an electrically conducting material, in order to transmitting the electric current supplied from the n-side electrode 13 to the n-type semiconductor layer 12n.

The light-reflecting layer 17p and the light-reflecting layer 17n have light-reflecting properties to light of a wavelength emitted from the semiconductor stacked layer body 12 so that the light-reflecting layer 17p and the light-reflecting layer 17n can respectively exhibit light-reflection which is at least better than the lower surface of the p-side electrode 15 and the lower surface of the n-side electrode 13 respectively. For example, Al, Ru, Ag, Ti, or Ni, or an alloy which contains one of those metals as its main component can be employed. The light-reflecting layer 17p and the light-reflecting layer 17n may have a multi-layer structure, in which a metal material with good light-reflecting properties as described above is used at least in the lowermost layer. The light-reflecting layer 17p and the light-reflecting layer 17n can be formed by using a same material in a same manufacturing step.

The light-transmissive electrode 14 is, as described above, for diffusing the electric current supplied via the p-side electrode 15 into the p-type semiconductor layer 12p, but in the present embodiment, an insulating layer 16 is disposed in a region under the p-side electrode 15. Although the light-reflecting layer 17p is arranged under the p-side electrode 15, the electric current supplied from the p-side electrode mainly flows in the light-reflecting layer 17p via the light-transmissive electrode 14. Aluminum that can be suitably used for the light-reflecting layer 17p has a large contact resistance with the light-transmissive electrode 14, which may be resulting in an increase of the Vf (forward voltage). Accordingly, in the case of disposing the light-reflecting layer 17p under the p-side electrode 15, the light-reflecting layer 17p is preferably disposed in a wider range which does not excessively increase the Vf.

Figure 3A:
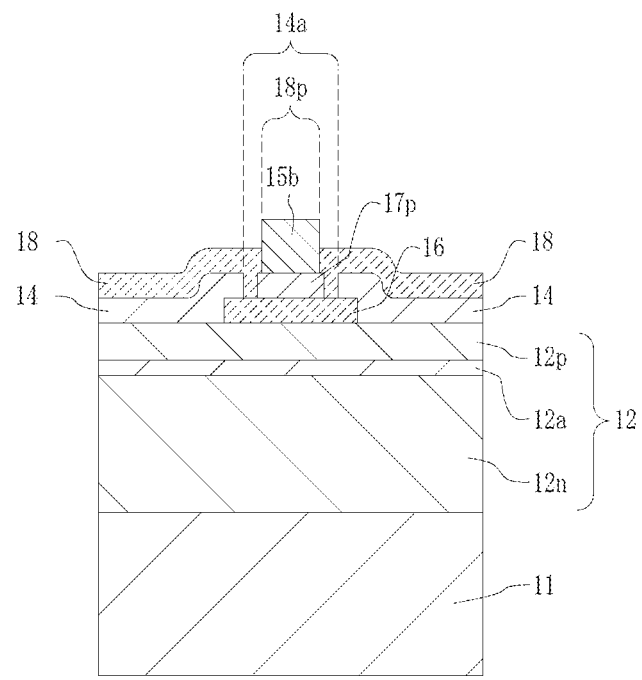
FIGS. 3A and 3B are each schematic diagram showing a configuration of a semiconductor light emitting element according to an embodiment of the present invention, where
Figure 3B:
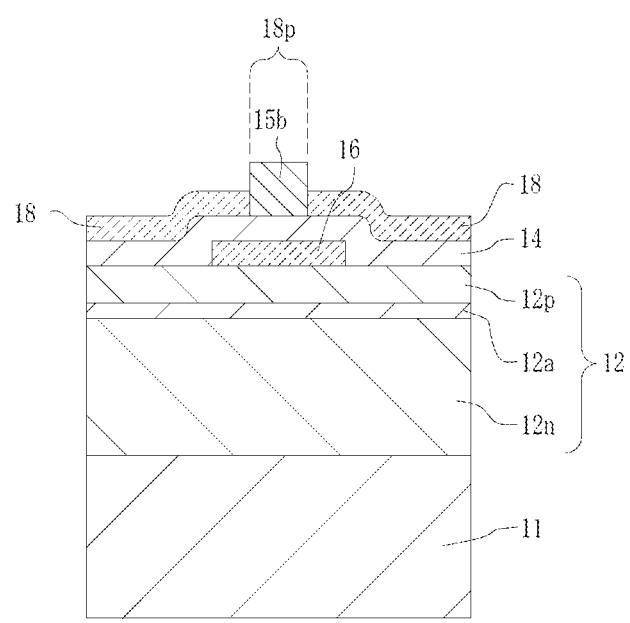
Figure 4:
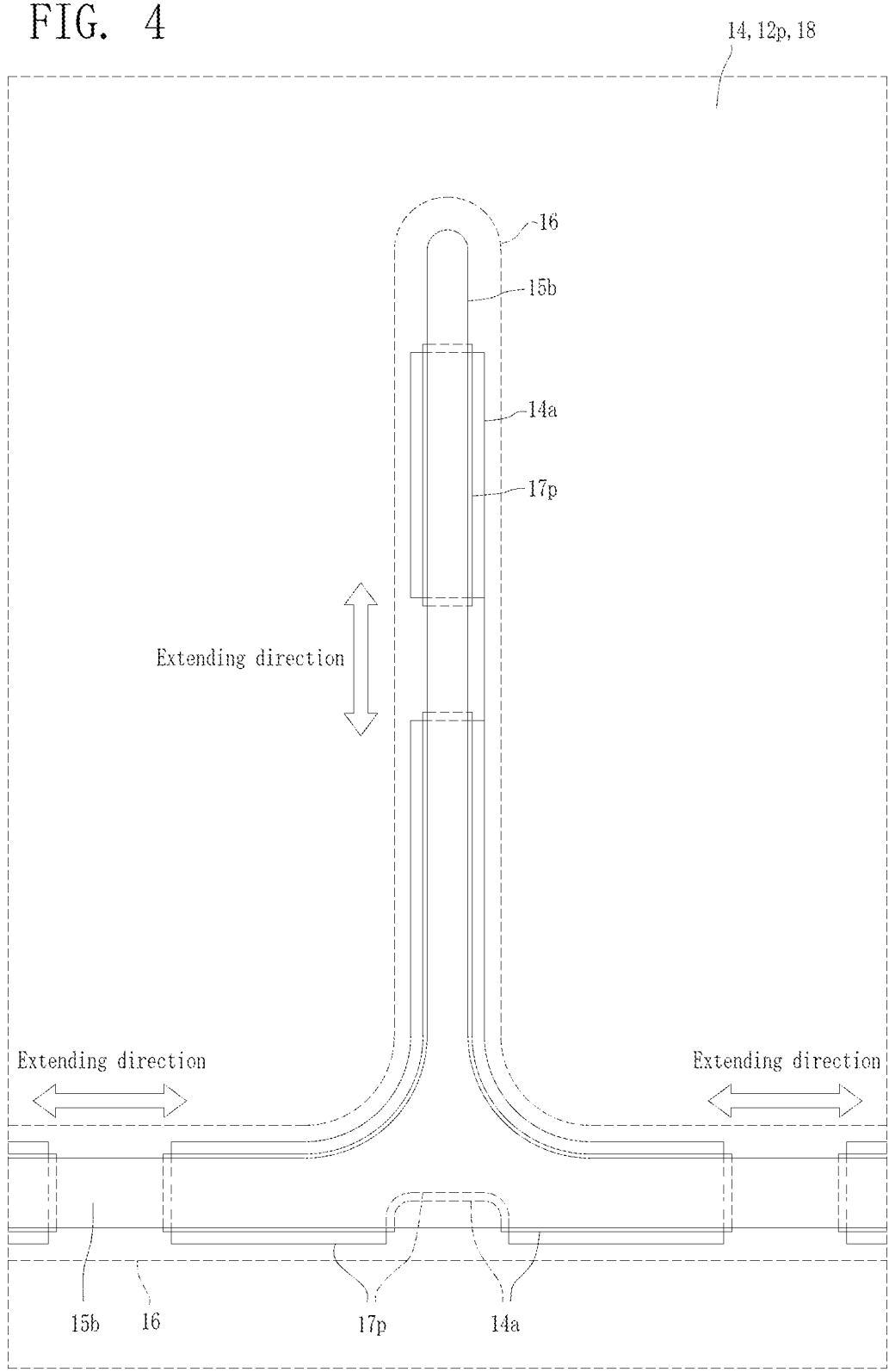
FIG. 4 is a schematic diagram illustrating a configuration of a semiconductor light emitting element according to an embodiment of the present invention, and is an enlarged plan view of a region B of FIG. 1A.
Figure 7B:
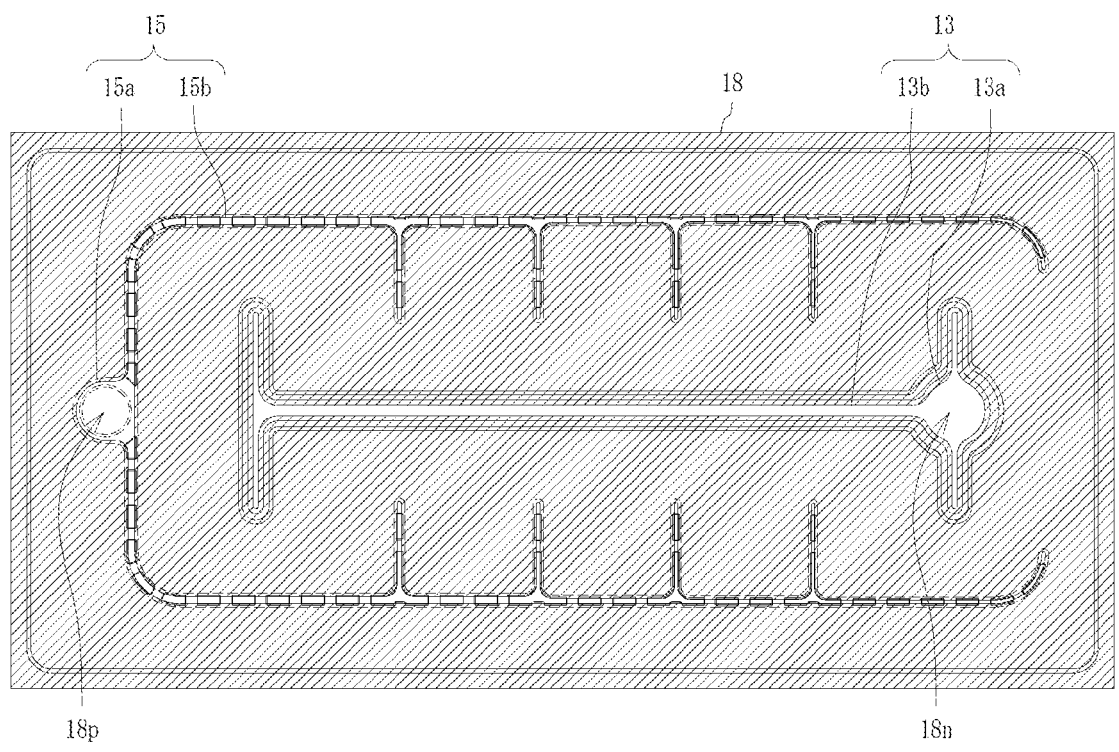

The protective layer 15 is light-transmissive and electrically insulating, and as shown in FIGS. 1A and 1B, and shown by hatching in FIG. 7B, the protective layer 18 is disposed to cover approximately a whole of the upper surface and the side surfaces of the light emitting element 1 except for the side surfaces and the lower surface of the growth substrate 11. Moreover, as shown in FIG. 1A to FIG. 3B, and FIG. 7B, the protective layer 18 defines an opening 18n at a portion of the bottom surface of the first exposed portion 12b, an n-side electrode 13 is disposed in the opening 18n. The protective layer 18 also defines an opening 18p at a portion above the insulating layer 16, and a p-side electrode 15 is disposed in the opening 18p. Thus, the protective layer 18 covers the upper surface and the side surfaces of the light emitting element 1 except for the regions provided with the n-side electrode 13 and the p-side electrode 15, the growth substrate 11, and a lower portion of the side surfaces of the outer periphery of the semiconductor stacked layer body 12 (that is a lower portion of the side surfaces of the outer periphery of the n-type semiconductor layer 12n). That is, with the protective layer 18, the entire surface of the light-transmissive electrode 14, the entire surface of the light-reflecting layer 17p, and the side surfaces of the p-type semiconductor layer 12p and the side surfaces of the active layer at the first exposed portion 12b and at the second exposed portion 12c of the semiconductor stacked layer body 12. Further, as shown in FIG. 3A, at the opening 14a of the light-transmissive electrode 14, the upper surfaces of the insulating layer 16 which are exposed at the gaps between the light-transmissive electrode 14 and the light-reflecting layer 17p are also covered with the protective layer 18. For the protective layer 18, a material similar to that used for the insulating layer 16 can be used, and for example, SiO$_2$ can be suitably used.

Operation of Light Emitting Element

Next, with reference to FIG. 1, a light emitting element according to a variant example of the first embodiment will be described. The light emitting element 1 is configured such that upon connecting an external power source between an external connection part 13a and an external connection part 15a via a mounting substrate or a bonding wire, electric current is supplied between the n-type semiconductor layer 12n and the p-type semiconductor layer 12p, and light is emitted from the active layer 12a. The light emitted from the active layer 12a of the light emitting element 1 propagates in the semiconductor stacked layer body 12, and is extracted to the outside mainly from the upper surface of the light emitting element 1.

Figure 8:
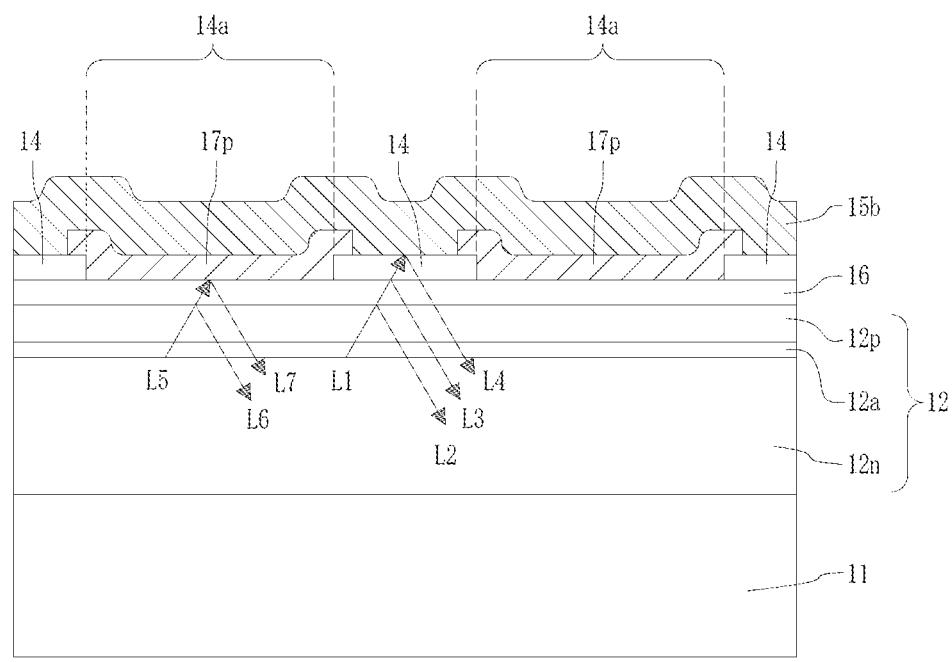
FIG. 8 is a schematic cross-sectional view illustrating extraction of light in a semiconductor light emitting element, according to an embodiment.

Next, with reference to FIG. 8, an optical path of light that is propagating in the semiconductor stacked layer body 12 toward the extending portion 15b of the p-side electrode 15 will be described. As shown in FIG. 8, the rays of light (L1) propagating in the semiconductor stacked layer body 12 toward a portion of the light-transmissive electrode 14 located at regions immediately beneath the extending portions 15b is partially reflected (L2) at the interface between the p-type semiconductor layer 12p and the insulating layer 16, partially reflected (L3) at the interface between the insulating layer 16 and the light-transmissive electrode 14, and partially reflected (L4) at the lower surface of the extending portion 15b of the p-side electrode 15. Those rays of light are partially absorbed by the insulating layer 16, the light-transmissive electrode 14, and the extending portion 15b, resulting in a reduction in the amount of light.

The rays of light (L5) propagating in the semiconductor stacked layer body 12 toward the light-reflecting layer 17p located in under the extending portion 15b are reflected (L6) at the interface between the p-type semiconductor layer 12p and the insulating layer 16 and partially reflected (L7) at the lower surface of the reflecting layer 17p. Those rays of light are also partially absorbed by the insulating layer 16 and the light-reflecting layer 17p, but light absorption by the light-transmissive electrode 14 can be avoided, and further, the rays of light can be reflected at the light-reflecting layer 17p more efficiently than at the extending portion 15b. Thus, the amount of light absorption can be decreased. Accordingly, the light extraction efficiency of the light emitting element 1 can be improved.

Method of Manufacturing Light Emitting Element

Figure 9:
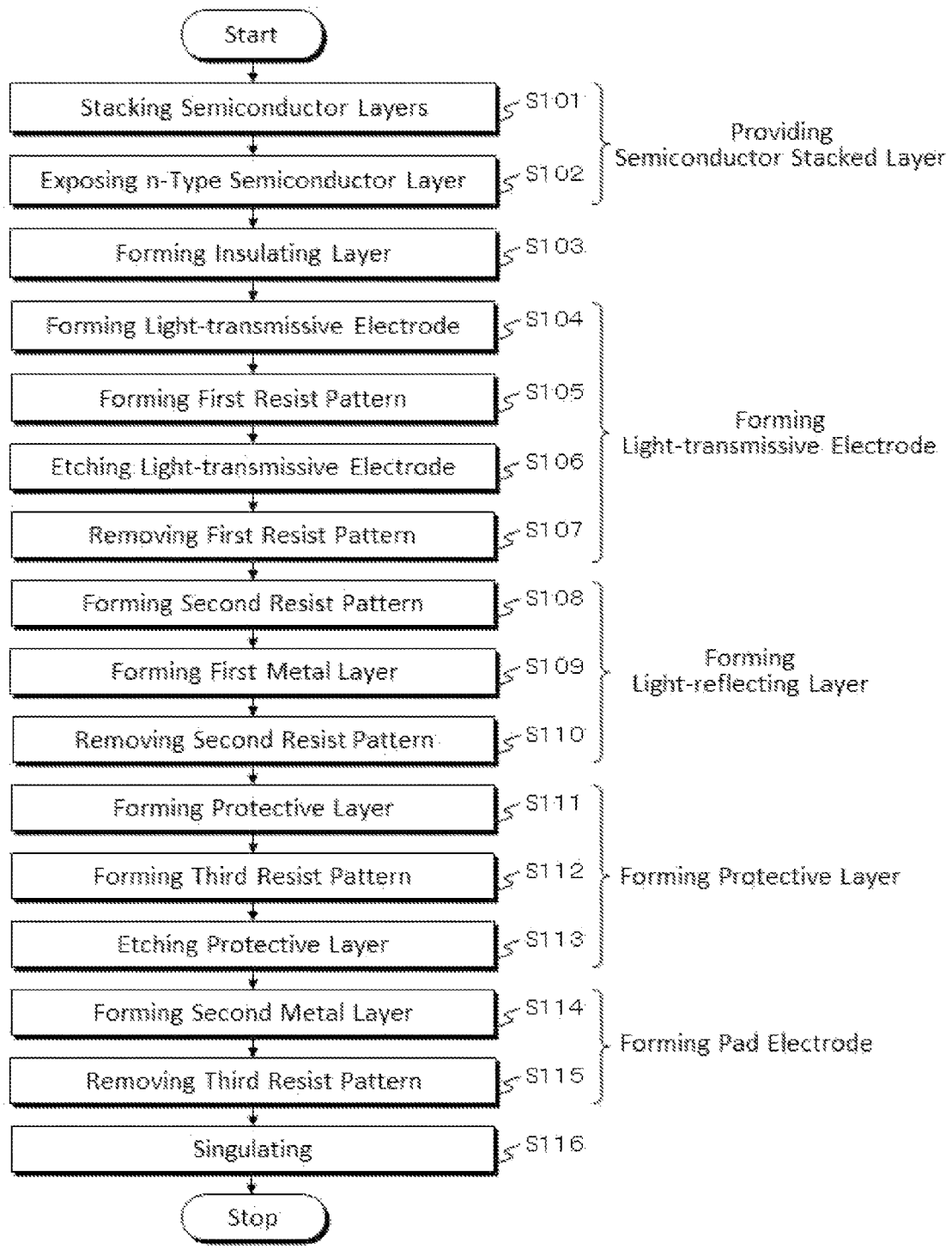
FIG. 9 is a flowchart showing the flow of operations of manufacturing a semiconductor light emitting element according to an embodiment of the present invention.

Next, with reference to FIG. 9, a method of manufacturing the light emitting element 1 shown in FIG. 1 will be described. As shown in FIG. 9, a method of manufacturing a light emitting element 1 includes the steps performed in the order of: stacking semiconductor layers (S101), exposing an n-type semiconductor layer (S102), forming an insulating layer (S103), forming a light-transmissive electrode (S104), forming a first resist pattern (S105), etching the light-transmissive electrode (S106), removing the first resist pattern (S105), forming a second resist pattern (S108), forming a first metal layer (S109), removing the second resist pattern (S110), forming a protective layer (S111), forming a third resist pattern (S112), etching the protective layer (S113), forming a second metal layer (S114), removing the third resist pattern (S115), and singulating (S116).

Figure 10A:
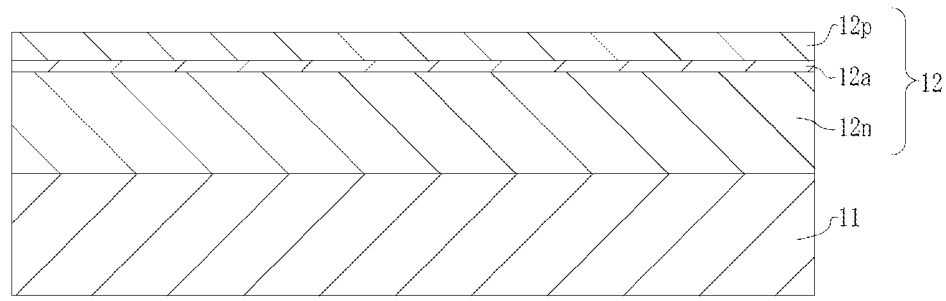
FIGS. 10A to 10C are each schematic cross-sectional view illustrating a step of stacking semiconductor layers in a method of manufacturing a semiconductor light emitting element according to an embodiment of the present invention, where
Figure 10B:
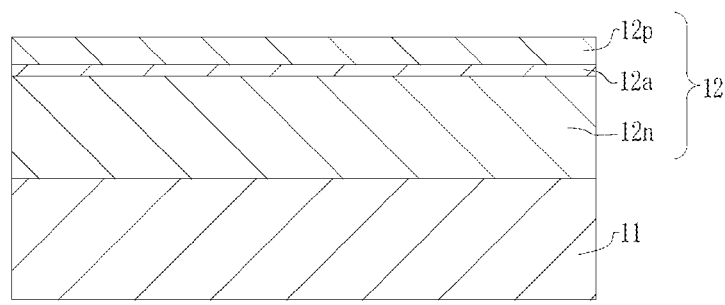
Figure 10C:
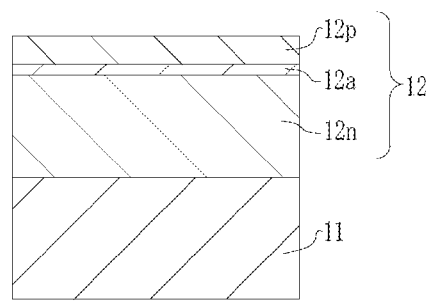

Now, with reference to FIG. 10A through FIG. 24C, (also, appropriately referring to FIG. 1A to FIG. 4 and FIG. 9), each operation will be described in detail below. In the drawings, FIG. 10A to FIG. 24C, those shown on the upper part of each set of figures (FIG. 10A, FIG. 11A, and so forth) respectively show a schematic cross-sectional view corresponding to the portion taken along line I-I of FIG. 1A. Those shown in the middle part (FIG. 10B, FIG. 11B, and so forth) respectively show a cross-sectional view corresponding to the portion taken along line II-II of FIG. 2A. Those shown the lower part (FIG. 10B, FIG. 11B, and so forth) respectively show a cross-sectional view corresponding to the portion taken along line III-III of FIG. 2A. In order to facilitate easy understanding, the views shown on the upper part of each set of figures (FIG. 10A, FIG. 11A, and so forth) are respectively a schematic cross-sectional view taken along a line corresponding to the line I-I of FIG. 1A. In those figures, dimensions in a lateral direction may be partially reduced or increased with respect to the dimensions in the cross-sectional view shown in FIG. 1B. The positions A1 to A6 shown in the lower part of FIG. 1B and the positions A1 to A6 shown in the lower part of FIG. 24A In each of FIG. 10A to FIG. 24C, any irregularities that may occur, due to the irregular shape of the lower layer part, on the upper surface of the first resist pattern 20, the second resist pattern 21, the third resist pattern 22, and/or the second metal layer, are not shown in the diagram. The sizes and the arrangement relationships of other members may be appropriately simplified or exaggerated.

Providing Semiconductor Stacked Layer Body

In a step of providing semiconductor stacked layer body, a semiconductor stacked layer body 12 having a first exposed portion 12b and a second exposed portion 12c is prepared. The step of providing semiconductor stacked layer body includes sub-steps of stacking semiconductor layers (S101) and exposing an n-type semiconductor layer (S102).

First, in the step of stacking semiconductor layers (S101), with the use of materials such as nitride semiconductors described above and by using a MOCVD method or the like, a semiconductor stacked layer body 12 is formed by stacking an n-type semiconductor layer 12n, a light emitting layer 12a, and a p-type semiconductor layer 12p in this order on an upper surface (one main surface) of a growth substrate 11 made of sapphire or the like. Note that, the step of stacking semiconductor layers (S101) to a step of removing third resist pattern (S115) are performed in wafer-level processing in which a plurality of light emitting elements 1 are formed on a single wafer that serves as the growth substrate 11. That is, a plurality of light emitting elements 1 are formed in a two-dimensional array on the growth substrate 11. Accordingly, the views shown on the upper part of each set of figures FIGS. 10A to 10C to FIGS. 24A to 24C (that is, FIG. 10A, FIG. 11A, and so forth) respectively illustrate a region corresponding to a single light emitting element, but light emitting elements 1 of the same shape are formed continuously in its right and left directions.

Figure 11A:
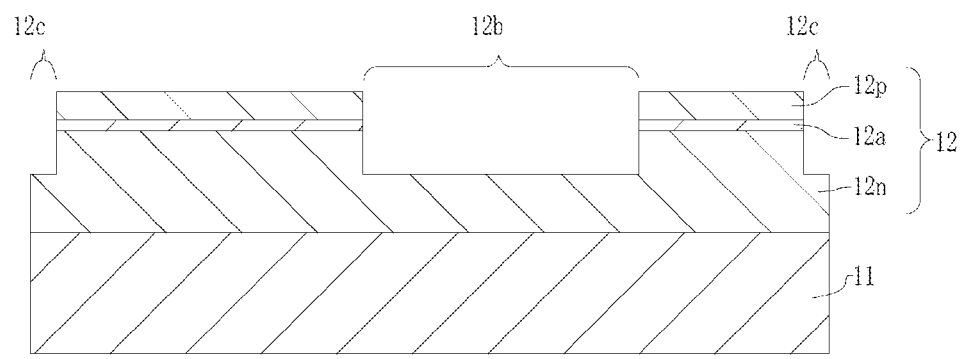
FIGS. 11A to 11C are each schematic cross-sectional view illustrating a step of exposing an n-type semiconductor layer in a method of manufacturing a semiconductor light emitting element according to an embodiment of the present invention, where
Figure 11B:
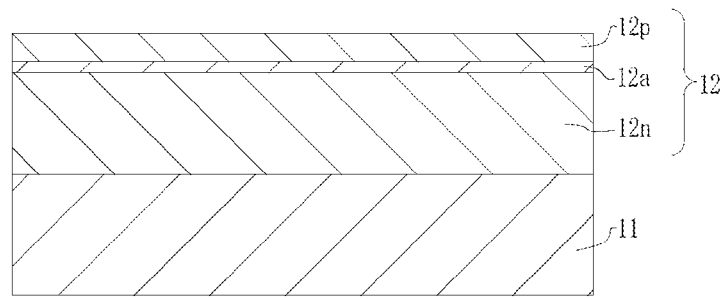
Figure 11C:
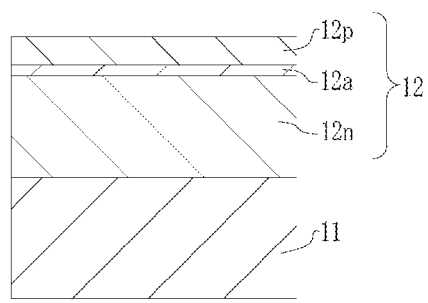

Next, in a step of exposing an n-type semiconductor layer (S102), as shown in FIGS. 11A to 11C, a first exposed region 12b for forming an n-side electrode 13, and a second exposed region 12c formed in a border region along the demarcation lines of a plurality of light emitting elements 1 are formed. The second exposed portion 12c serves as a border region (dicing street) at the time of cutting to obtain individual light emitting elements 1 in a step of singulating (S116) to be described below. The first exposed portion 12b and the second exposed portion 12c are formed such that, using a photolithography method, a resist pattern defining openings at locations corresponding to form the first exposed portion 12b and the second exposed portion 12c is formed; using the resist pattern as a etching mask, the semiconductor stacked layer body 12 is etched from its upper surface side to expose the n-type semiconductor layer 12n.

Forming Insulating Layer

Figure 12A:
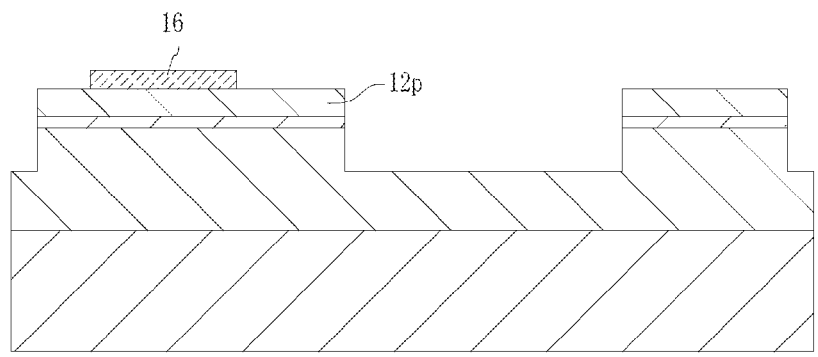
FIGS. 12A to 12C are each schematic cross-sectional view illustrating a step of forming an insulating layer in a method of manufacturing a semiconductor light emitting element according to an embodiment of the present invention, where
Figure 12B:
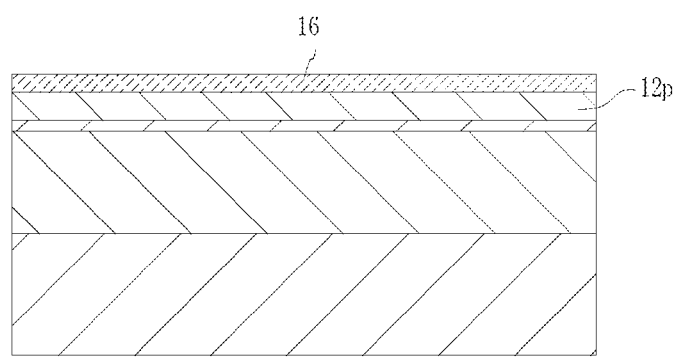
Figure 12C:
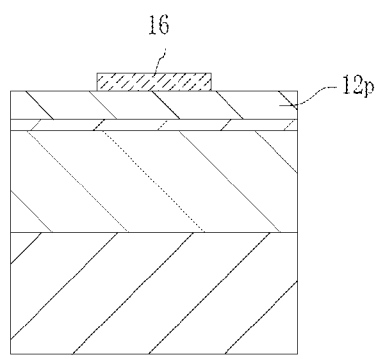

Next, in a step of forming an insulating layer (S103), as shown in FIGS. 12A to 12C, an insulating layer 16 is formed on the region designated for disposing the p-side electrode and a region in the vicinity thereof. The step of forming an insulating layer (S103) can be performed in a similar manner as in a method described in JP2008-192710A for example. That is, in the step of forming an insulating layer (S103), first, with the use of an electrically insulating and light transmissive material such as SiO2 and a sputtering method, for example, an insulating layer 16 is formed on the entire upper surface of the semiconductor stacked layer body 12 Next, with the use of a photolithography method, a resist pattern is formed to cover the regions where the insulating layer 16 is disposed at the time of completion. Then, with the use of the resist pattern as an etching mask, the insulating layer 16 is etched and patterned into a predetermined shape. Then, the resist pattern is removed.

Forming Light-Transmissive Electrode

Next, in a step of forming a light-transmissive electrode (S104), a light transmissive electrode 14 is formed to cover approximately entire surface of the p-type semiconductor layer 12p and approximately entire surface of the insulating layer 16. The step of forming a light-transmissive electrode includes sub-steps of forming a light-transmissive electrode (S104), forming a first resist pattern (S105), etching the light-transmissive electrode (S106), and removing the first resist pattern (S107).

Figure 13A:
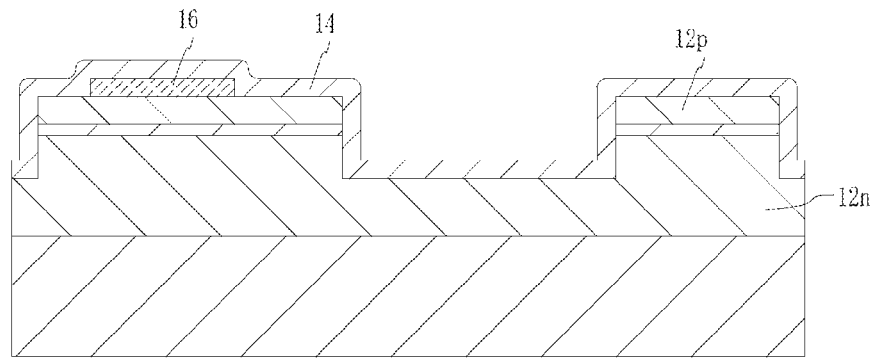
FIGS. 13A to 13C are each schematic cross-sectional view illustrating a step of forming a light-transmissive electrode in a method of manufacturing a semiconductor light emitting element according to an embodiment of the present invention, where
Figure 13B:
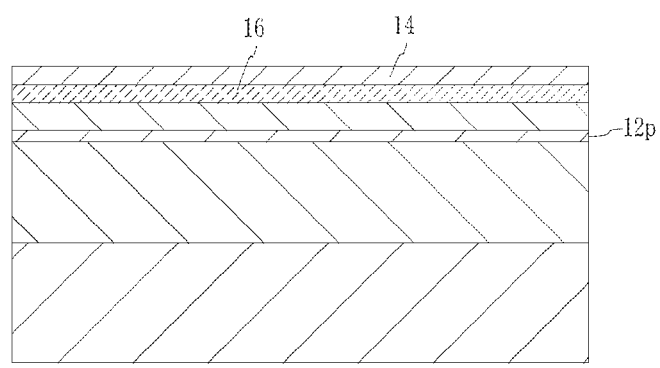
Figure 13C:
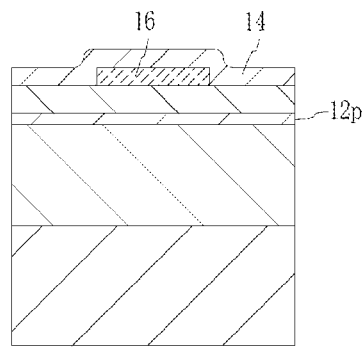

First, in the step of forming a light-transmissive electrode (S104), as shown in FIGS. 13A to 13C, a light-transmissive electrode 14 is formed to cover the top surfaces of the semiconductor stacked layer body 12 and the insulating layer 16, by using a light-transmissive electrically conductive material such as ITO and by using a sputtering method or the like.

Figure 14A:
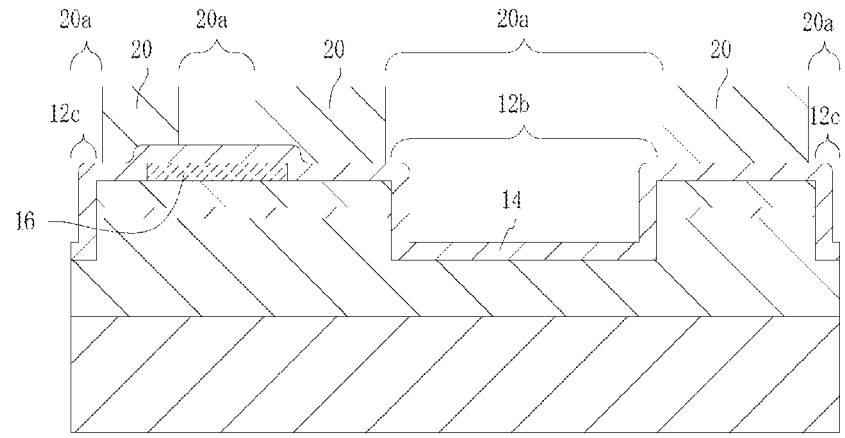
FIGS. 14A to 14C are each schematic cross-sectional view illustrating a step of forming a first resist pattern in a method of manufacturing a semiconductor light emitting element according to an embodiment of the present invention, where
Figure 14B:
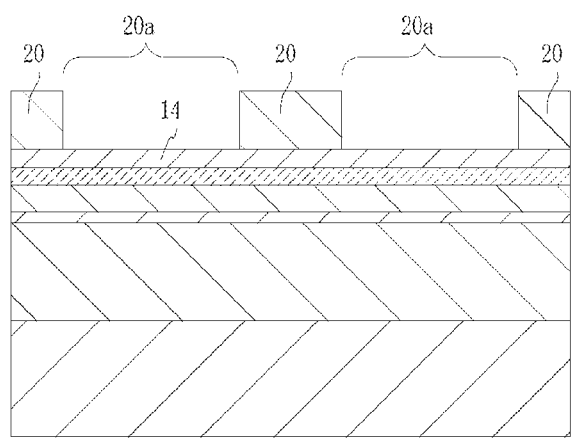
Figure 14C:
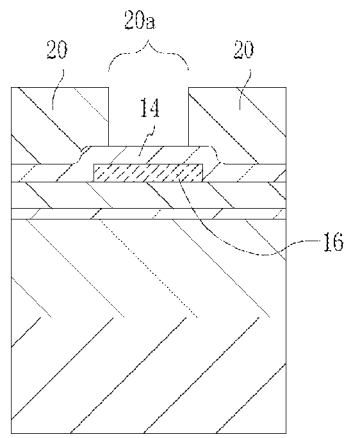

Next, in the step of forming a first resist pattern (S105), as shown in FIGS. 14A to 14C, on the light-transmissive electrode 14 formed on the p-type semiconductor layer 12p, by using a photolithography method, a first resist pattern 20 is formed to cover the regions where the light-transmissive electrode 14 is disposed at the time of completion. The first resist pattern 20 is formed to define openings 20a corresponding to the entire surface of the first exposed portion 12b, the entire surface of the second exposed portion 12c, and intermittently to the regions where the insulating layer 16 are arranged.

Figure 15A:
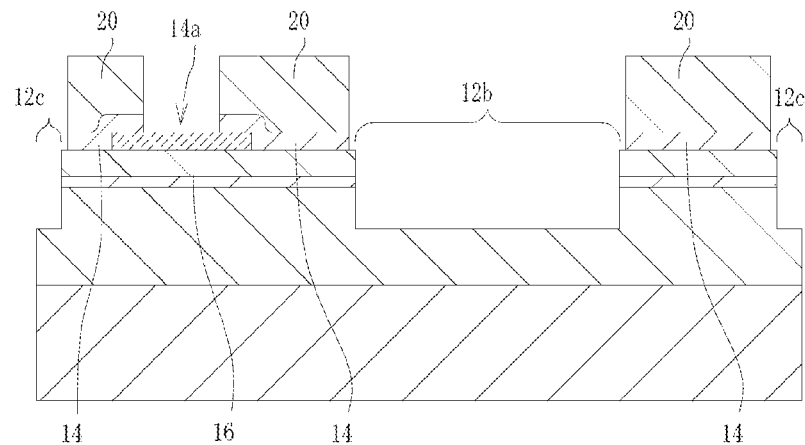
FIGS. 15A to 15C are each schematic cross-sectional view illustrating a step of etching a light-transmissive electrode in a method of manufacturing a semiconductor light emitting element according to an embodiment of the present invention, where
Figure 15B:
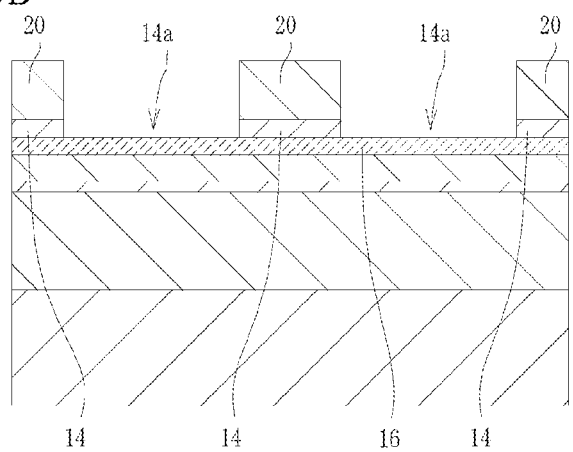
Figure 15C:
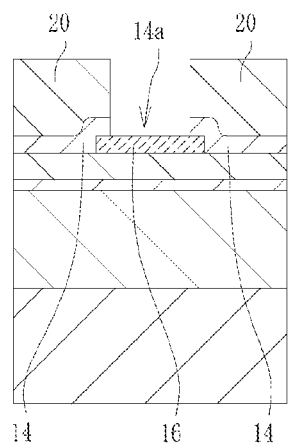

Next, in a step of etching the light-transmissive electrode (S106), as shown in FIGS. 15A to 15C, using the first resist pattern 20 as an etching mask, the light-transmissive electrode 14 is etched. Accordingly, the first exposed portion 12b and the second exposed portion 12c are exposed again, while approximately the entire surfaces of the regions for disposing the p-type semiconductor layer 12p have been kept covered. The patterned light-transmissive electrode 14 defines an opening 14a corresponding to a region where an external connection portion 15a (see FIG. 1B) of the p-side electrode 15 to be disposed, while defining intermittent openings 14a along the region where the extending portion 15b (see FIG. 2B and FIG. 3A) to be disposed. Through this step, the insulating layer 16 is exposed in the openings 14a.

Figure 16A:
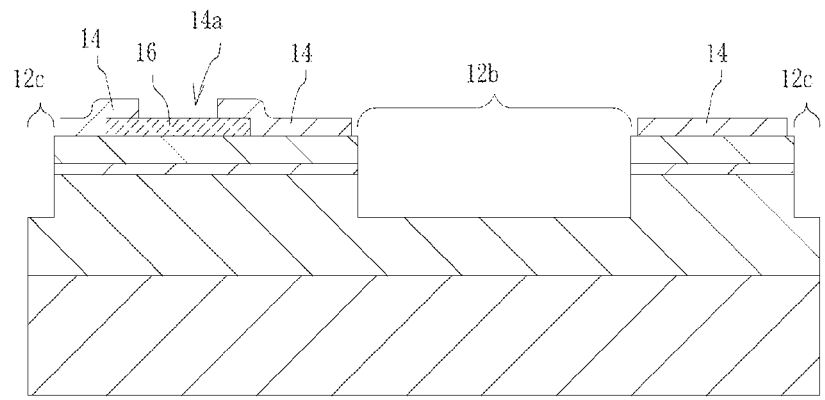
FIGS. 16A to 16C are each schematic cross-sectional view illustrating a step of removing a first resist pattern in a method of manufacturing a semiconductor light emitting element according to an embodiment of the present invention, where
Figure 16B:
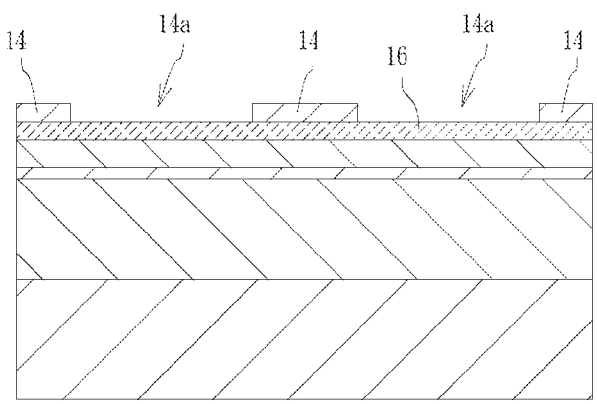
Figure 16C:
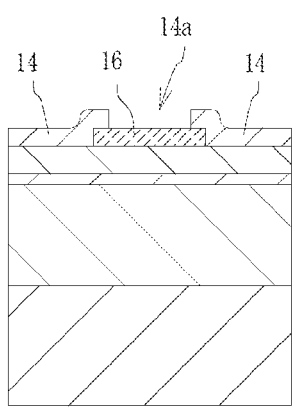

Next, in a step of removing the first resist pattern (S107), as shown in FIGS. 16A to 16C, the first resist pattern 20 is removed by using an appropriate chemical agent, or by using a technique such as ashing or dry etching.

Forming Light-reflecting Layer

Next, in a step of forming a light-reflecting layer, a light-reflecting layer 17p is formed in the openings 14a of the light-transmissive electrode 14. In this step, simultaneously with a light-reflecting layer 17p a light-reflecting layer 17n is formed on the bottom surface of the first exposed portion 12b. The step of forming light-reflecting layer includes sub-steps of forming a second resist pattern (S108), forming a first metal layer (S109), and removing the second resist pattern (S110).

Figure 17A:
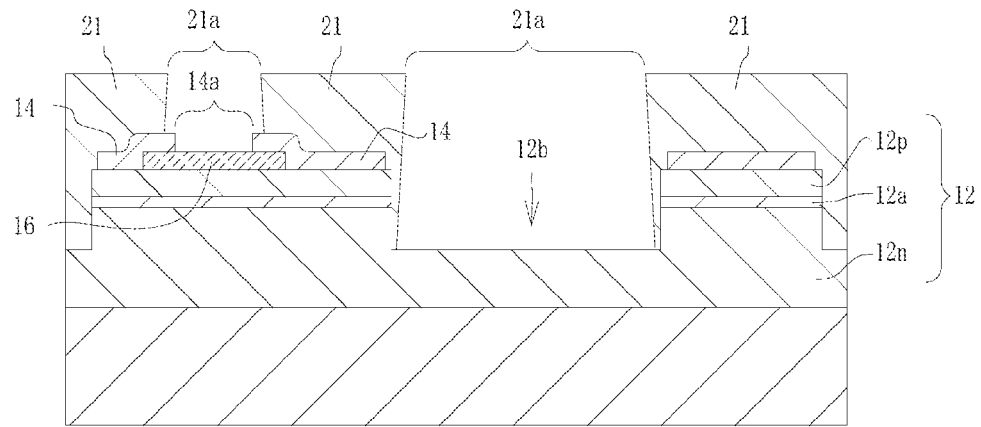
FIGS. 17A to 17C are each schematic cross-sectional view illustrating a step of disposing a second resist pattern in a method of manufacturing a semiconductor light emitting element according to an embodiment of the present invention, where
Figure 17B:
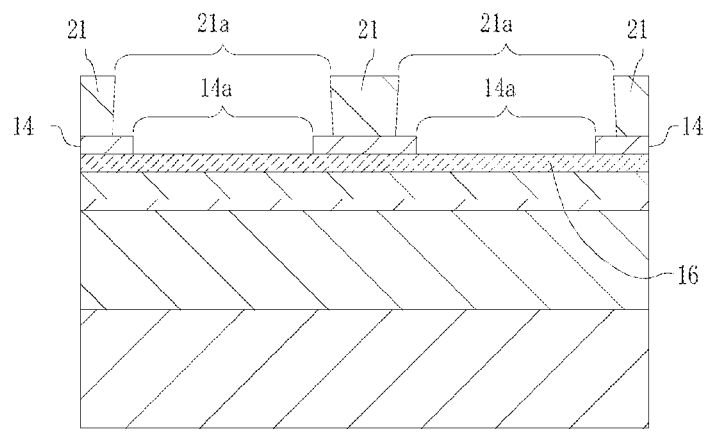
Figure 17C:
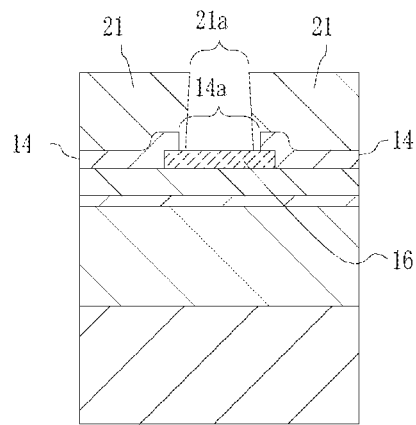

First, in a step of forming a second resist pattern (forming resist pattern) (S108), as shown in FIGS. 17A to 17C, openings 14a of the light-transmissive electrode 14 are formed, and then, a second resist pattern 21 is formed by using a photolithography method so that openings 21a are defined corresponding to the regions to form the light-reflecting layer 17p (see FIG. 1B). The second resist pattern 21 also defines an opening 21a corresponding to the region to form the light-reflecting layer 17n (see FIG. 1B) at the bottom surface of the first exposed portion 12b.

Those openings 21a are defined with inclined surfaces so that a planar dimension of each opening 21a decreases upward (as an increasing distance from the semiconductor stacked layer body 2). In other words, the openings 21a are each defined by inclined surfaces respectively have a reverse-tapered shape in which side surfaces are inclined to outwardly increase the outer circumference of the opening 21a in a plan view. With defining the openings 20a by a reverse-tapered shape, the first metal layer 31 formed in the step of forming a first metal layer (S109) which is performed next to the step of forming second resist pattern 21 is made discontinuous between the upper surface of the second resist pattern 21 and in the opening 21a. Thus, patterning of the first metal layer 31 by using a lift-off method can be facilitated while sufficiently avoiding the occurrence of burrs at end portions of the first metal layer 31 that remain in the openings 21a.

With the use of a negative type photoresist as the second resist pattern 21, the openings 21a can be defined by a reverse-tapered shape. This will be described below. In the step of forming second resist pattern, first, a negative type photoresist is applied on the top surface of the wafer. Next, with the use of a photomask provided with an exposure pattern, portions not to be removed are exposed to light. At this time, light is absorbed by the photoresist, so that the exposure amount of the light decreases toward a lower portion of the photoresist. The exposure light not only propagates in a direction perpendicular to the upper surface of the photoresist but also in a lateral direction but also slightly spread in a lateral direction. Accordingly, portions of the photoresist in regions directly below the opening edges of the photomask and in the vicinities of lower edges of the openings, rays of light irradiated on the light shielding regions (i.e. non-opening portions) of the photomask do not have sufficient amount of spreading light, thus lacking the exposure amount of light compared to that of lower portions of the photoresist around the center of the openings of the photomask.

In a negative type photoresist, portions exposed to light chemically react and become insoluble in a developing solvent. Accordingly, in the vicinities of edge portions of the openings of the photomask, the chemical reaction may become difficult to proceed due to the lacking of the exposure amount of light, even while the upper portions of the photoresist receive sufficient exposure amount of light. As a result, the side surfaces of the resist pattern formed after development on the photoresist are formed in a reverse-tapered shape in which the lower portion is inclined inwardly than the upper portion.

Figure 18A:
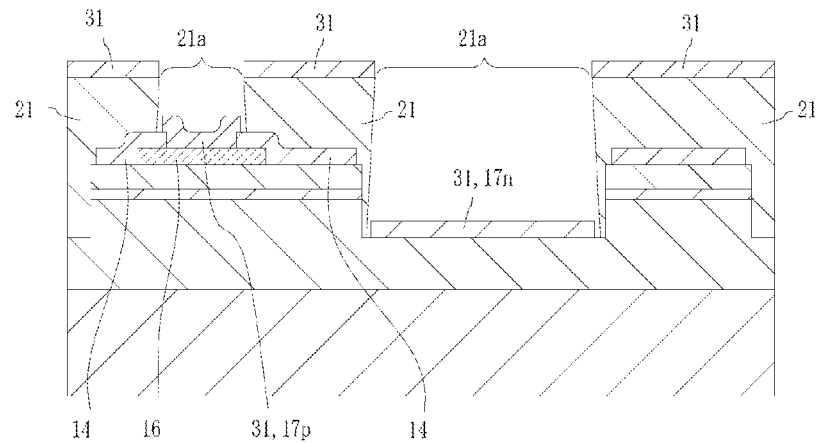
FIGS. 18A to 18C are each schematic cross-sectional view illustrating a step of disposing a first metal layer in a method of manufacturing a semiconductor light emitting element according to an embodiment of the present invention, where
Figure 18B:
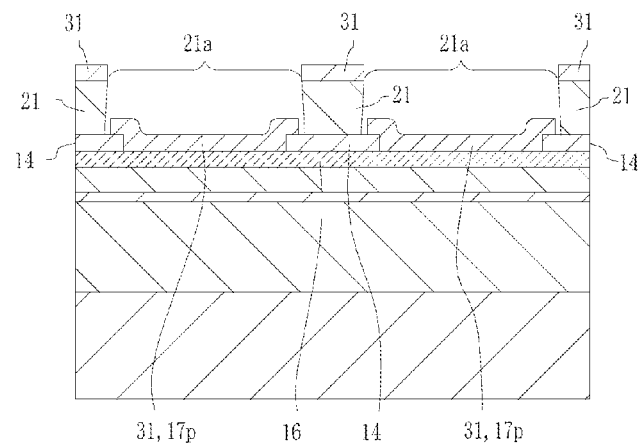
Figure 18C:
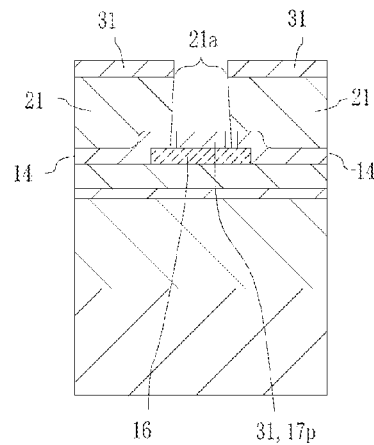
Figure 19A:
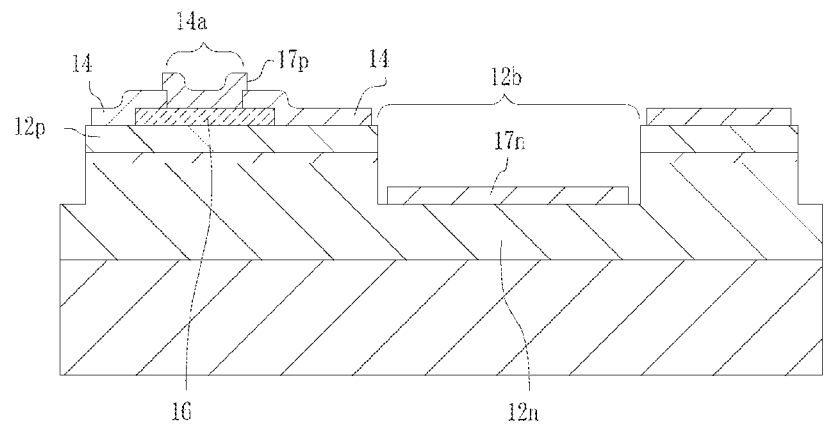
FIGS. 19A to 19C are each schematic cross-sectional view illustrating a step of removing a second resist pattern in a method of manufacturing a semiconductor light emitting element according to an embodiment of the present invention, where
Figure 19B:
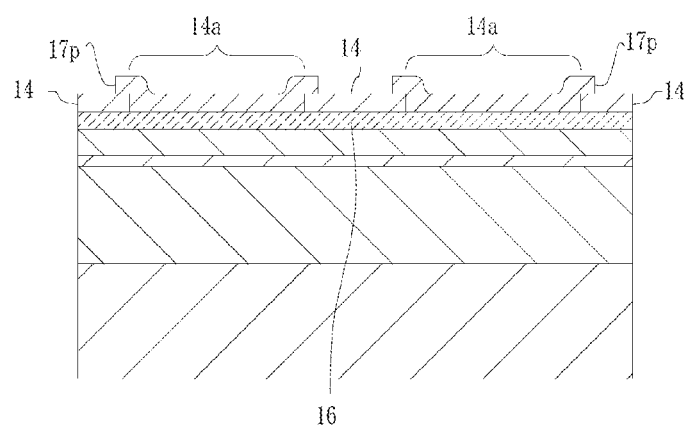
Figure 19C:
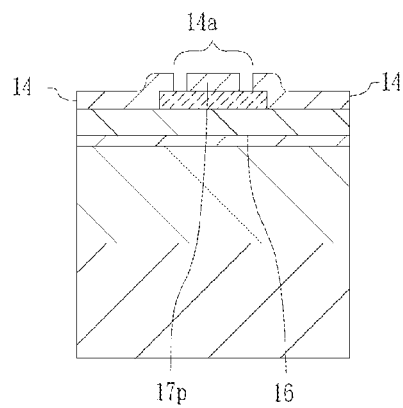

Next, in a step of forming a first metal layer (forming metal layer) (S109), as shown in FIG. 18, a first metal layer 31 is formed on the entire upper surface of the wafer which is provided with the second resist pattern 21, with the use of a material having good light-reflecting properties such as aluminum, by way of a sputtering method or a vapor deposition method. At this time, as shown in FIG. 18B, the light-reflecting layers 17p are formed respectively, in the extending direction of the extending portion 15b (see FIG. 2A), with the full-length of the insulating layer 16 exposed in the opening 14a (see FIG. 17B) and extending onto a portion of the upper surface of the light-transmissive electrode 14 at each end of the opening. As shown in FIG. 18C, the light-reflecting layers 17p are disposed respectively, along the direction (e.g. width direction) in a plan view intersecting perpendicularly to the extending direction of the extending portion 15b (see FIG. 3A), in a region narrower than the full-width of the insulating layer 16 exposed in each of the openings 14a (see FIG. 17C). In the width direction, the light-reflecting layers 17p may be formed with a width appoximate to the full-width of the corresponding openings 14a of the light-transmissive electrode 14, and further, in a similar manner as in the extending direction, may be formed extended onto the upper surface of the light-transmissive electrode 14.

In a configuration in which the openings 14a are formed by partially removing the light-transmissive electrode 14 to be respectively replaced with the light-reflecting layers 17p, made of a metal layer, the insulating layer 16 disposed below the light-reflecting layer 17p and the protective layer 18 disposed above the light-reflecting layer 17p are respectively made of materials of either similar kinds or different kinds, provided that the materials can be eroded by a same etching solution. Accordingly, upon occurrence of a gap between the light-transmissive electrode 14 and the light-reflecting layer 17p in the openings 14a, in a step of etching a protective layer (S113) to be described below, at the time of patterning the protective layer 18 by etching, the etching solution may permeate through the gaps, eroding the insulating layer 16.

Thus, as described above, providing the light-reflecting layers 17p at least along the extending direction of the extending portion 15b to cover the insulating layer 16 exposed in the openings 21a, in a step of etching the protective layer (S113), permeation of the etching solution into the insulating layer 16 can be prevented.

As shown in FIG. 18A, in the region for disposing the external connection portion 15a (see FIGS. 1A and 1B), the entire surfaces that define the opening 14a of the light-transmissive electrode 14 are covered with the light-reflecting layer 17p, and further, the light-reflecting layer 17p is formed extended onto the upper surface of the light-transmissive electrode 14. That is, in the region, the upper surface and the side surfaces of the insulating layer 16 are completely covered with the light-transmissive electrode 14 and the light-reflecting layer 17p. Accordingly, in the step of etching the protective layer (S113), at the time of etching the protective layer 18, permeation of the etching solution into the insulating layer 16 can be prevented.

Next, in a step of removing the second resist pattern (removing resist pattern) (S110), as shown in FIG. 19, the second resist pattern 21 is removed (lift-off) with the first metal layer 31 formed on the upper surface thereof. Thus, the first metal layer 31 is patterned and the light-reflecting layer 17p and the light-reflecting layer 17n are formed.

Forming Protective Layer

Next, in a step of forming a protective layer, a protective layer 18 is formed to cover approximately the entire upper surface of the wafer. The protective layer 18 defines, as shown in FIGS. 1A and 1B, an opening 18n in the region to dispose the n-side electrode 13, and an opening 18p in the region to dispose the p-side electrode 15. The step of forming protective layer includes sub-steps of forming a protective layer (S111), forming a third resist pattern: S112, and etching the protective layer (S113).

Figure 20A:
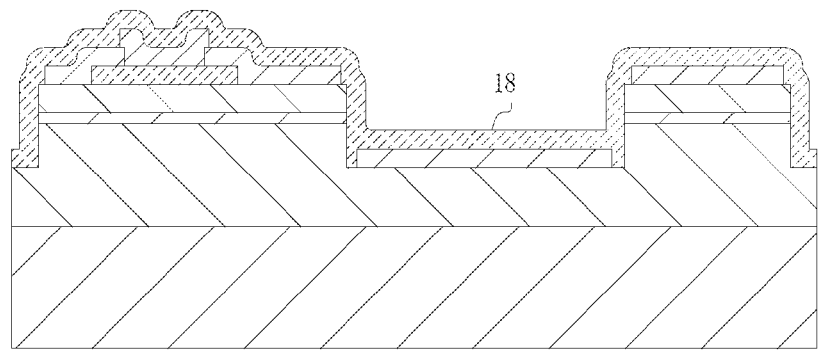
FIGS. 20A to 20C are each schematic cross-sectional view illustrating a step of forming a protective layer in a method of manufacturing a semiconductor light emitting element according to an embodiment of the present invention, where
Figure 20B:
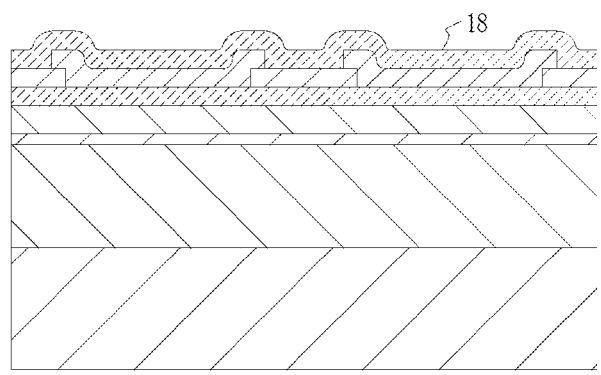
Figure 20C:
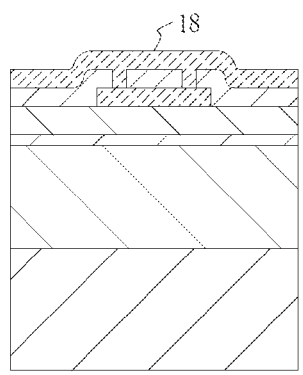

First, in the step of forming a protective layer (S111), as shown in FIGS. 20A to 20C, with the use of a material having electrically insulating and light-transmissive properties such as SiO₂ as described above, and by using sputtering method or the like, a protective layer 18 is formed on the entire upper surface of the wafer. At this time, the protective layer 18 is preferably made of a same material of the insulating layer 16. With this arrangement, the protective layer 18 and the insulating layer 16 can be formed by using the same apparatus, so that the productivity can be improved.

In a first sub-process (forming first resist pattern), using a photolithography method, a first resist pattern having openings in conformity to the upper surfaces of the n-side electrodes 13 and the upper surfaces of the p-side electrodes 15 is formed on the upper surface of the wafer. At this time, as shown in FIG. 21C, the opening 22a corresponding to the disposing region of the extending portion 15b (see FIGS. 3A and 3B) is formed within a region directly above the light-reflecting layer 17p in a direction perpendicularly intersecting the extending direction of the extending portion 15b in a plan view. Forming the opening 22a as described above, in the direction perpendicularly intersecting the extending direction of the extending portion 15b, the protective layer 18 that covers the gaps between the light-transmissive electrode 14 and the light-reflecting layer 17p is covered with the third resist pattern 22. Accordingly, in the following step, permeation of the etching solution into the insulating layer 16 through the gaps can be prevented.

Figure 21A:
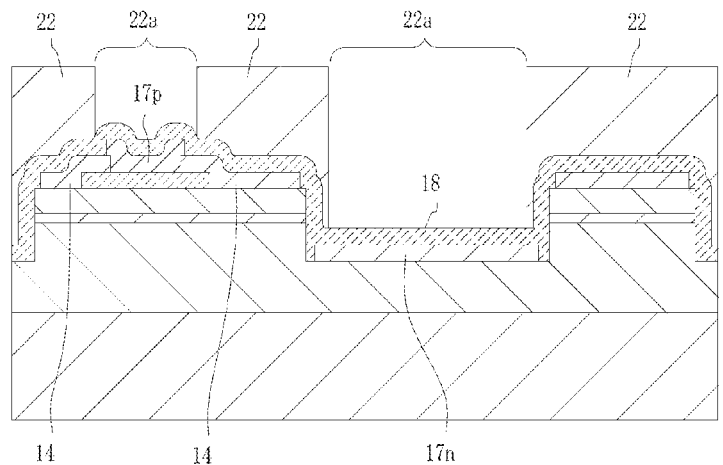
FIGS. 21A to 21C are each schematic cross-sectional view illustrating a step of forming a third resist pattern in a method of manufacturing a semiconductor light emitting element according to an embodiment of the present invention, where
Figure 21B:
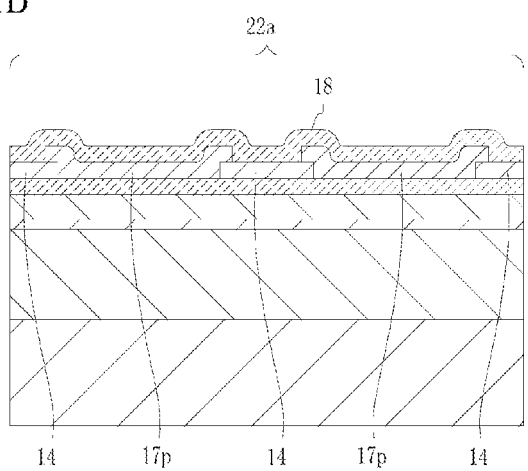
Figure 21C:
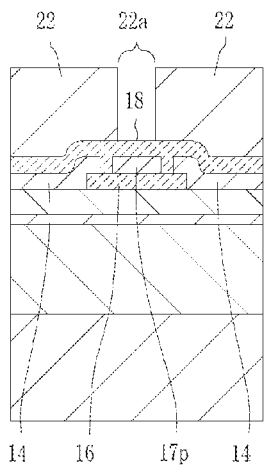

As shown in FIG. 21B, in the extending direction of the extending portion 15b, the insulating layer 16 is covered with the light-transmissive electrode 14 and the light-reflecting layer 17 without any gap. Thus, in the following step, permeation of the etching solution into the insulating layer 16 can be prevented. That is, permeation of the etching solution from the opening 14a (see FIGS. 19A to 19C) of the light-transmissive electrode 14 into the insulating layer 16 can be prevented in all directions.

As described above, in the external connection portion 15a (FIGS. 1A and 1B) of the p-side electrode 15, the insulating layer 16 is covered with the light-transmissive electrode 14 and the light-reflecting layer 17p. Accordingly, permeation of the etching solution into the insulating layer 16 can be prevented.

Figure 22A:
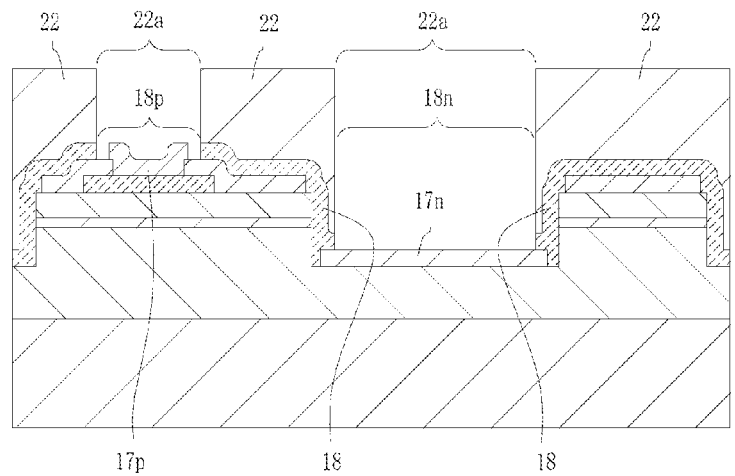
FIGS. 22A to 22C are each schematic cross-sectional view illustrating a step of etching a protective layer in a method of manufacturing a semiconductor light emitting element according to an embodiment of the present invention, where
Figure 22B:
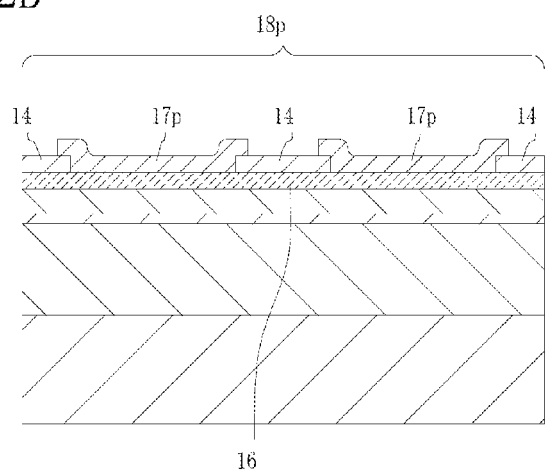
Figure 22C:
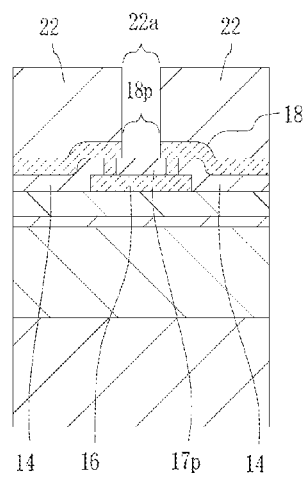

Next, in a step of etching the protective layer (S113), as shown in FIGS. 22A to 22C, with the use of a third resist pattern 22 as an etching mask, the protective layer 18 is wet-etched to form the opening 18n and the opening 18p. In this step, for example, in the case of using SiO₂ as the protective layer 18, buffered fluorine (BHF) can be used as the etching solution.

The protective layer 18 and the insulating layer 16 can be made of either the same material or different materials. For example, in the case where the protective layer 18 is made of SiO₂ and BHF is used as the etching solution, a material that can be eroded by BHF, such as TiO₂, SiN, can be used as the insulating layer 16. That is, covering of the opening 14a of the light-transmissive electrode 14 with the light-reflecting layer 17p and the third resist pattern 22 is advantageous not only in the case of forming the protective layer 18 and the insulating layer 16 with the use of a same material, but also in the case of forming those with the use of different materials.

As shown in FIGS. 22A to 22C, by forming the opening 18n in the protective layer 18, the light-reflecting layer 17n is exposed. Also, by forming the opening 18p in the protective layer 18, the light-reflecting layer 17p and the light-transmissive electrode 14 are exposed in the disposing region of the external connection portion 15a (FIGS. 1A and 1B) of the p-side electrode 15. Further, as shown in FIG. 22B, in the disposing region of the extending portion 15b (FIGS. 1A and 1B), the protective layer 18 is entirely removed in the extending direction of the extending portion 15b, to expose the light-transmissive electrode 14 and the light-reflecting layer 17p. Meanwhile, as shown in FIG. 22C, in the arranging region of the extending portion 15b (FIGS. 1A and 1B), in the direction perpendicularly intersecting the extending direction of the extending portion 15b, the protective layer 18 is entirely removed in a range smaller than the light-reflecting layer 17p to expose the light-reflecting layer 17p, but the light-transmissive electrode 14 and the insulating layer 16 are not exposed.

Note that after the step of etching the protective layer (S113), the third resist pattern 22 is not removed so that it can be also used in the following step of forming pad electrode.

Forming Pad Electrode

Next, in a step of forming pad electrode, an n-side electrode 13 and a p-side electrode 15 which serve as the pad electrodes of the light emitting element 1 are formed in the openings 18n, 18p of the protective layer 18, respectively. The step of forming pad electrode includes sub-steps of forming a second metal layer (S114) and removing the third resist pattern (S115). In the step of forming pad electrode, with the use of the third resist pattern 22 that is formed in the preceding step of forming protective layer and using a lift-off method, an n-side electrode 13 and a p-side electrode 15 which serve as the pad electrodes are formed.

Figure 23A:
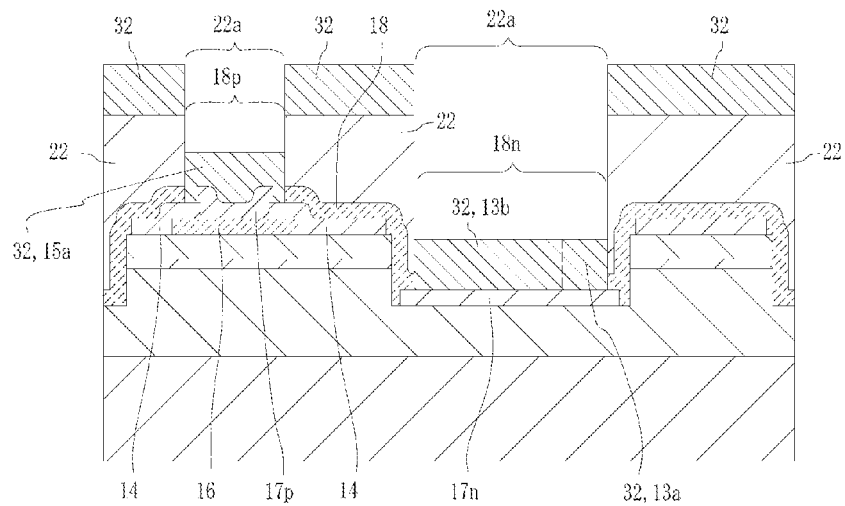
FIGS. 23A to 23C are each schematic cross-sectional view illustrating a step of forming a second metal layer in a method of manufacturing a semiconductor light emitting element according to an embodiment of the present invention, where
Figure 23B:
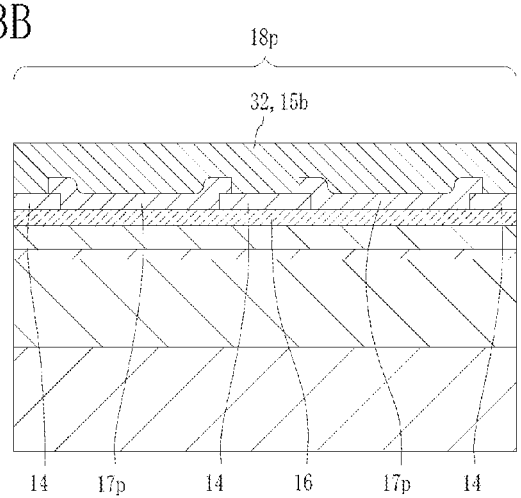
Figure 23C:
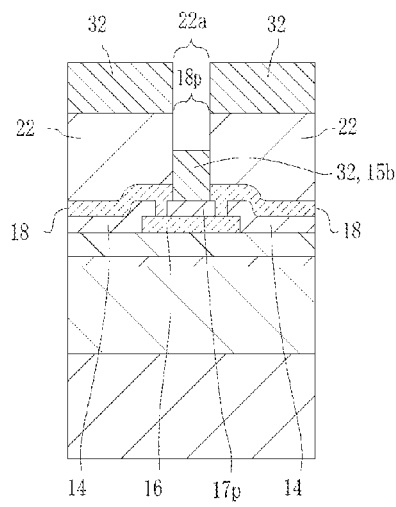

First, in a step of forming a second metal layer (S114), as shown in FIGS. 23A to 23C, a second metal layer 32 to be an n-side electrode 13 and a p-side electrode 15 is formed on the entire upper surface of the wafer, with the use of a metal material such as gold as described above and using a sputtering method or a vapor deposition method. The second metal layer 32 is formed in the openings 22a of the third resist pattern 22, that is, the second metal layer 32 is formed so as to be in contact with the light-reflecting layer 17n exposed in the opening 18n of the protective layer 18 and the light-reflecting layer 17p and the light-transmissive electrode 14 which are exposed in the opening 18p.

Figure 24A:
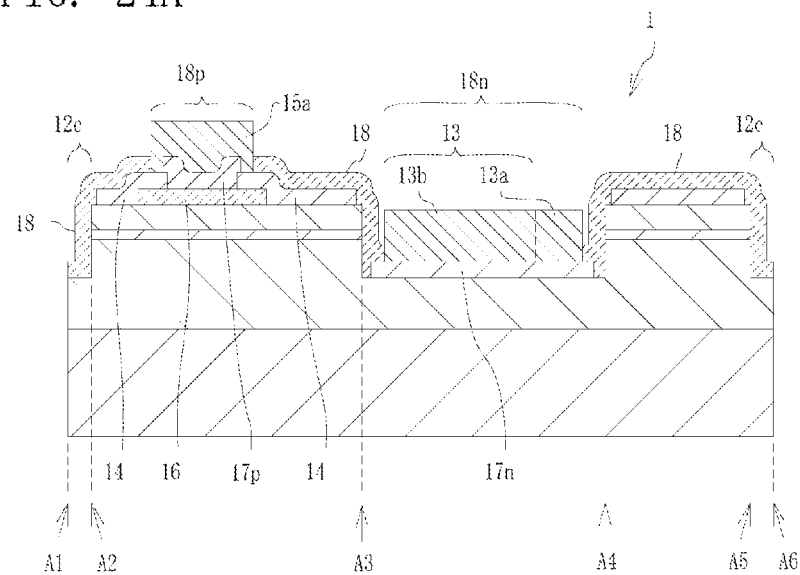
FIGS. 24A to 24C are each schematic cross-sectional view illustrating a step of removing a third resist pattern in a method of manufacturing a semiconductor light emitting element according to an embodiment of the present invention, where
Figure 24B:
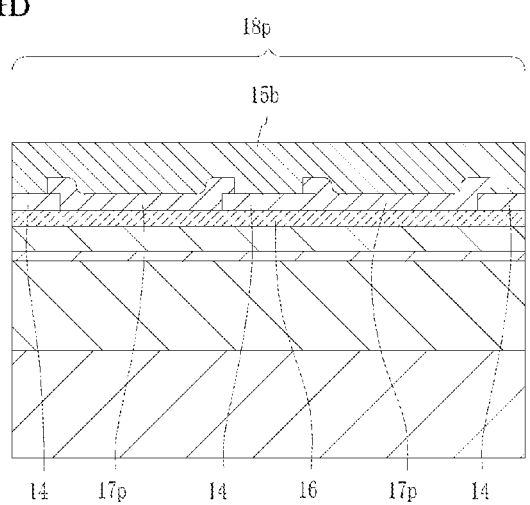
Figure 24C:
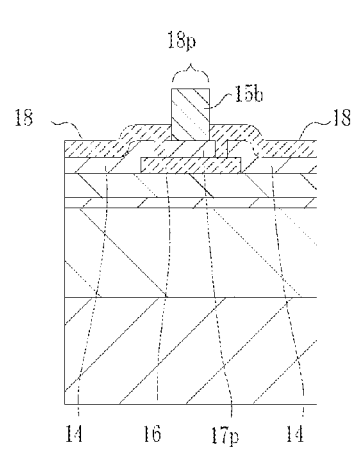

Next, in a step of removing the third resist pattern (S115), the third resist pattern 22 is removed with the second metal layer 32 formed thereon. Thus, the second metal layer 32 is patterned and as shown in FIGS. 24A to 24C, the external connection portion 13a and the extending portion 13b of the n-side electrode 13 and the external connection portion 15a and the extending portion 15b of the p-side electrode 15 are formed.

As described above, the protective layer 18 defining the openings 18n, 18p is formed and then the n-side electrode 13 and the p-side electrode 15 which serve as the pad electrodes are formed in the openings 18n, 18p respectively. Thus, the resist pattern for the patterning the protective layer 18 and the resist pattern for the patterning the pad electrodes can be shared. Accordingly, the number of production steps for forming the resist pattern can be reduced, and producibility can be improved.

Singulating

Next, in a step of singulating (S116), using a dicing method or a scribing method, cutting is performed along the virtual border lines set on the second exposed portion 12c (see FIG. 24A) to singulate into individual light emitting elements. Note that before cutting the wafer, the back surface of the growth substrate 11 may be polished to reduce the thickness.

Either before or after singulating, a reflecting layer made of a metal or a DBR (distributed Bragg reflector) layer, for example, may be disposed on the back side of the growth substrate 11. Further, a fluorescent material layer may be disposed on the light extracting surface side of the light emitting element 1. As described above, the light emitting element 1 can be formed.

As shown in the above, a semiconductor light emitting element and a method of manufacturing the semiconductor light emitting element are illustrated in accordance with the embodiments for carrying out the present invention, but the scope of the invention is not limited to the above description, and should be widely understood based on the scope of claim for patent. Further, based on the above description, it will be obvious that various changes and modifications can be made therein without departing from the scope of the invention.

What is claimed is:

1. A method of manufacturing a semiconductor light emitting element that includes a substrate, a semiconductor stacked layer body on a main surface of the substrate, a light-transmissive electrode disposed on the semiconductor stacked layer body, a pad electrode having an external connection portion and an extending portion, the external connection portion being electrically connected to the light-transmissive electrode for electrically connecting to outside, and the extending portion being extending from the external connection portion, and a protective layer covering the semiconductor stacked layer body and the light-transmissive electrode, the method comprising:
    providing a semiconductor stacked layer body;
    forming an insulating layer on a portion of the semiconductor stacked layer body such that, in a plan view, the insulating layer partially overlaps at least a portion of a region for forming a pad electrode;
    forming a light-transmissive electrode covering an upper surface of the semiconductor stacked layer body and an upper surface of the insulating layer, and on a region at least partially overlapping a region for disposing an extending portion in a plan view, the light-transmissive electrode intermittently defining openings in an extending direction of the extending portion;
    forming a light reflecting layer, made of a metal material, in each of the openings of the light-transmissive electrode, the light reflecting layer extending in the extending direction onto a portion of the light-transmissive electrode at each end of each opening;
    forming a protective layer on the main surface side of the substrate;
forming a mask on an upper surface of the protective layer except for the region for forming the pad electrode, such that, in a plan view, the mask covers both ends of the light-reflecting layer in a direction perpendicular to the extending direction;
etching the protective layer to form an opening in the protective layer by using wet etching to remove the protective layer exposed in an opening of the mask; and
    forming a pad electrode in the opening of the protective layer.

2. The method of manufacturing a semiconductor light emitting element according to claim 1, wherein:
    the insulating layer is formed using a material having a refractive index to light emitted from the semiconductor stacked layer body smaller than a refractive index of the light-transmissive electrode, and
    a lower surface of the light-reflecting layer is formed using a material having a reflectance to light emitted from the semiconductor stacked layer body greater than a reflectance of a lower surface of the pad electrode.

3. The method of manufacturing a semiconductor light emitting element according to claim 1, wherein the insulating layer is made of a light-transmissive material.

4. The method of manufacturing a semiconductor light emitting element according to claim 1, wherein the protective layer is made of a light-transmissive material.

5. The method of manufacturing a semiconductor light emitting element according to claim 1, wherein the insulating layer and the protective layer are formed using a same material.

6. The method of manufacturing a semiconductor light emitting element according to claim 2, wherein the insulating layer and the protective layer are formed using a same material.

7. The method of manufacturing a semiconductor light emitting element according to claim 1, wherein the insulating layer and the protective layer are made of an oxide selected from the group consisting of $SiO_2$, $TiO_2$, or $Al_2O_3$.

8. The method of manufacturing a semiconductor light emitting element according to claim 2, wherein the insulating layer and the protective layer are made of an oxide selected from the group consisting of $SiO_2$, $TiO_2$, or $Al_2O_3$.

9. The method of manufacturing a semiconductor light emitting element according to claim 1, wherein the light reflecting layer includes a metal selected from the group consisting of Al, Ru, Ag, Ti, and Ni or an alloy whose main component is a metal selected from the group consisting of Al, Ru, Ag, Ti, and Ni.

10. The method of manufacturing a semiconductor light emitting element according to claim 2, wherein the light reflecting layer includes a metal selected from the group consisting of Al, Ru, Ag, Ti, and Ni or an alloy whose main component is a metal selected from the group consisting of Al, Ru, Ag, Ti, and Ni.

11. The method of manufacturing a semiconductor light emitting element according to claim 5, wherein the light reflecting layer includes a metal selected from the group consisting of Al, Ru, Ag, Ti, and Ni or an alloy whose main component is a metal selected from the group consisting of Al, Ru, Ag, Ti, and Ni.

12. The method of manufacturing a semiconductor light emitting element according to claim 8, wherein the light reflecting layer includes a metal selected from the group consisting of Al, Ru, Ag, Ti, and Ni or an alloy whose main component is a metal selected from the group consisting of Al, Ru, Ag, Ti, and Ni.

13. The method of manufacturing a semiconductor light emitting element according to claim 1, wherein the light-transmissive electrode contains a metal oxide selected from indium tin oxide (ITO), $In_2O_3$, $SnO_2$ and ZnO.

14. The method of manufacturing a semiconductor light emitting element according to claim 2, wherein the light-transmissive electrode contains a metal oxide selected from indium tin oxide (ITO), $In_2O_3$, $SnO_2$ and ZnO.

15. The method of manufacturing a semiconductor light emitting element according to claim 3, wherein the light-transmissive electrode contains a metal oxide selected from indium tin oxide (ITO), $In_2O_3$, $SnO_2$ and ZnO.

16. The method of manufacturing a semiconductor light emitting element according to claim 4, wherein the light-transmissive electrode contains a metal oxide selected from indium tin oxide (ITO), $In_2O_3$, $SnO_2$ and ZnO.

17. The method of manufacturing a semiconductor light emitting element according to claim 5, wherein the light-transmissive electrode contains a metal oxide selected from ITO (indium tin oxide), $In_2O_3$, $SnO_2$ and ZnO.

18. The method of manufacturing a semiconductor light emitting element according to claim 1, wherein the step of forming the light-reflecting layer further comprising sub-steps of:
    forming a resist pattern with an opening corresponding to a region for disposing the light-reflecting layer;
    forming a metal layer adapted for the light-reflecting layer on the resist pattern and the opening defined in the resist pattern; and
    removing the resist pattern together with the metal layer formed on the resist pattern,
    wherein the resist pattern is formed by using a photolithography method using a negative type photoresist such that side surfaces defining the opening of the resist pattern are inclined to have, in a plan view, a smaller opening at an upper side.

19. The method of manufacturing a semiconductor light emitting element according to claim 2, wherein the step of forming the light-reflecting layer further comprises:
    forming a resist pattern with an opening corresponding to a region for disposing the light-reflecting layer;
    forming a metal layer adapted for the light-reflecting layer on the resist pattern and the opening defined in the resist pattern; and
    removing the resist pattern together with the metal layer formed on the resist pattern,
    wherein the resist pattern is formed by using a photolithography method using a negative type photoresist such that side surfaces defining the opening of the resist pattern are inclined to have, in a plan view, a smaller opening at an upper side.

20. The method of manufacturing a semiconductor light emitting element according to claim 5, wherein the step of forming the light-reflecting layer further comprises:
    forming a resist pattern with an opening corresponding to a region for disposing the light-reflecting layer;
    forming a metal layer adapted for the light-reflecting layer on the resist pattern and the opening defined in the resist pattern; and
    removing the resist pattern together with the metal layer formed on the resist pattern, wherein
    the resist pattern is formed by using a photolithography method using a negative type photoresist such that side surfaces defining the opening of the resist pattern are inclined to have, in a plan view, a smaller opening at an upper side.

21. The method of manufacturing a semiconductor light emitting element according to claim 7, wherein the step of forming the light-reflecting layer further comprises:
    forming a resist pattern with an opening corresponding to a region for disposing the light-reflecting layer;
    forming a metal layer adapted for the light-reflecting layer on the resist pattern and the opening defined in the resist pattern; and
    removing the resist pattern together with the metal layer formed on the resist pattern,
    wherein the resist pattern is formed by using a photolithography method using a negative type photoresist such that side surfaces defining the opening of the resist pattern are inclined to have, in a plan view, a smaller opening at an upper side.

* * * * *